(12) United States Patent
Kim et al.

(10) Patent No.: US 11,729,942 B2
(45) Date of Patent: Aug. 15, 2023

(54) DEVICE FOR LIGHT SINTERING AND COOLING METHOD FOR DEVICE FOR LIGHT SINTERING

(71) Applicant: IUCF-HYU (INDUSTRY-UNIVERSITY COOPERATION FOUNDATION HANYANG UNIVERSITY, Seoul (KR)

(72) Inventors: Hak-Sung Kim, Seoul (KR); Yong Rae Jang, Ansan-si (KR); Wan Ho Chung, Paju-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 478 days.

(21) Appl. No.: 16/901,346

(22) Filed: Jun. 15, 2020

(65) Prior Publication Data

US 2021/0051817 A1 Feb. 18, 2021

Related U.S. Application Data

(63) Continuation of application No. PCT/KR2018/015889, filed on Dec. 14, 2018.

(30) Foreign Application Priority Data

Dec. 15, 2017 (KR) ........................ 10-2017-0172835

(51) Int. Cl.
*G06F 1/16* (2006.01)
*H05K 7/00* (2006.01)
(Continued)

(52) U.S. Cl.
CPC ......... *H05K 7/20236* (2013.01); *B05D 3/065* (2013.01); *H05K 7/20272* (2013.01)

(58) Field of Classification Search
CPC ...... G02B 7/1815; G02B 5/10; H05B 3/0033; B05D 3/065; H05K 7/20236; H05K 7/20272
See application file for complete search history.

(56) References Cited

U.S. PATENT DOCUMENTS

| | | | |
|---|---|---|---|
| 2004/0035555 A1* | 2/2004 | Nara ................ | H05K 7/20272 257/E23.098 |
| 2005/0072559 A1* | 4/2005 | Ippoushi ............ | H05K 7/20272 165/104.33 |

(Continued)

FOREIGN PATENT DOCUMENTS

| JP | 2008-235678 A | 10/2008 |
|---|---|---|
| KR | 20-0447650 Y1 | 2/2010 |

(Continued)

OTHER PUBLICATIONS

International Search Report for PCT/KR2018/015889 dated Mar. 20, 2019 [PCT/ISA/210].

(Continued)

*Primary Examiner* — Anthony M Haughton
(74) *Attorney, Agent, or Firm* — Sughrue Mion, PLLC

(57) ABSTRACT

A light sintering device is provided. The light sintering device can comprise: a housing having, therein, a cooling hollow portion in which cooling water flows; a beam guide mounted on one side of the housing so as to form one wall of the cooling hollow portion, and guiding sintered light; and an optical filter mounted on the other side of the housing so as to face the beam guide, thereby forming the other wall of the cooling hollow portion, and filtering out a specific wavelength of the sintered light.

9 Claims, 23 Drawing Sheets

(51) Int. Cl.
    *H05K 5/00*     (2006.01)
    *H05K 7/20*     (2006.01)
    *B05D 3/06*     (2006.01)

(56) References Cited

U.S. PATENT DOCUMENTS

| | | | | |
|---|---|---|---|---|
| 2011/0122381 | A1* | 5/2011 | Hickerson | B33Y 30/00 |
| | | | | 355/45 |
| 2013/0020511 | A1* | 1/2013 | Kameda | G02B 7/1815 |
| | | | | 250/504 R |
| 2017/0318682 | A1* | 11/2017 | Kim | H05K 3/125 |
| 2020/0218001 | A1* | 7/2020 | Hoelen | F21V 9/30 |
| 2021/0007182 | A1* | 1/2021 | Kim | H05B 3/0033 |
| 2021/0051817 | A1* | 2/2021 | Kim | H05K 7/20236 |

FOREIGN PATENT DOCUMENTS

| | | |
|---|---|---|
| KR | 10-2012-0134035 A | 12/2012 |
| KR | 10-1356731 B1 | 2/2014 |
| KR | 10-1526937 B1 | 6/2015 |
| KR | 10-1728981 B1 | 5/2017 |
| KR | 10-1740002 B1 | 5/2017 |

OTHER PUBLICATIONS

Written Opinion for PCT/KR2018/015889 dated Mar. 20, 2019 [PCT/ISA/237].

* cited by examiner

[Fig. 1]
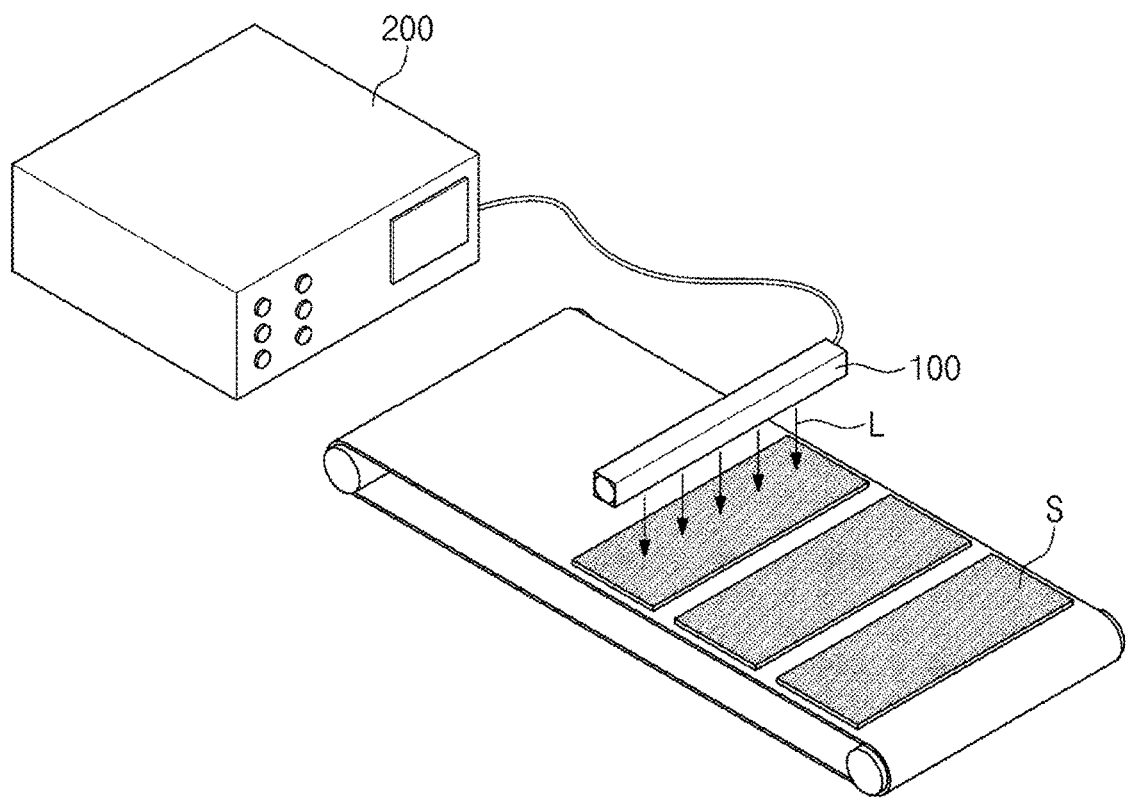

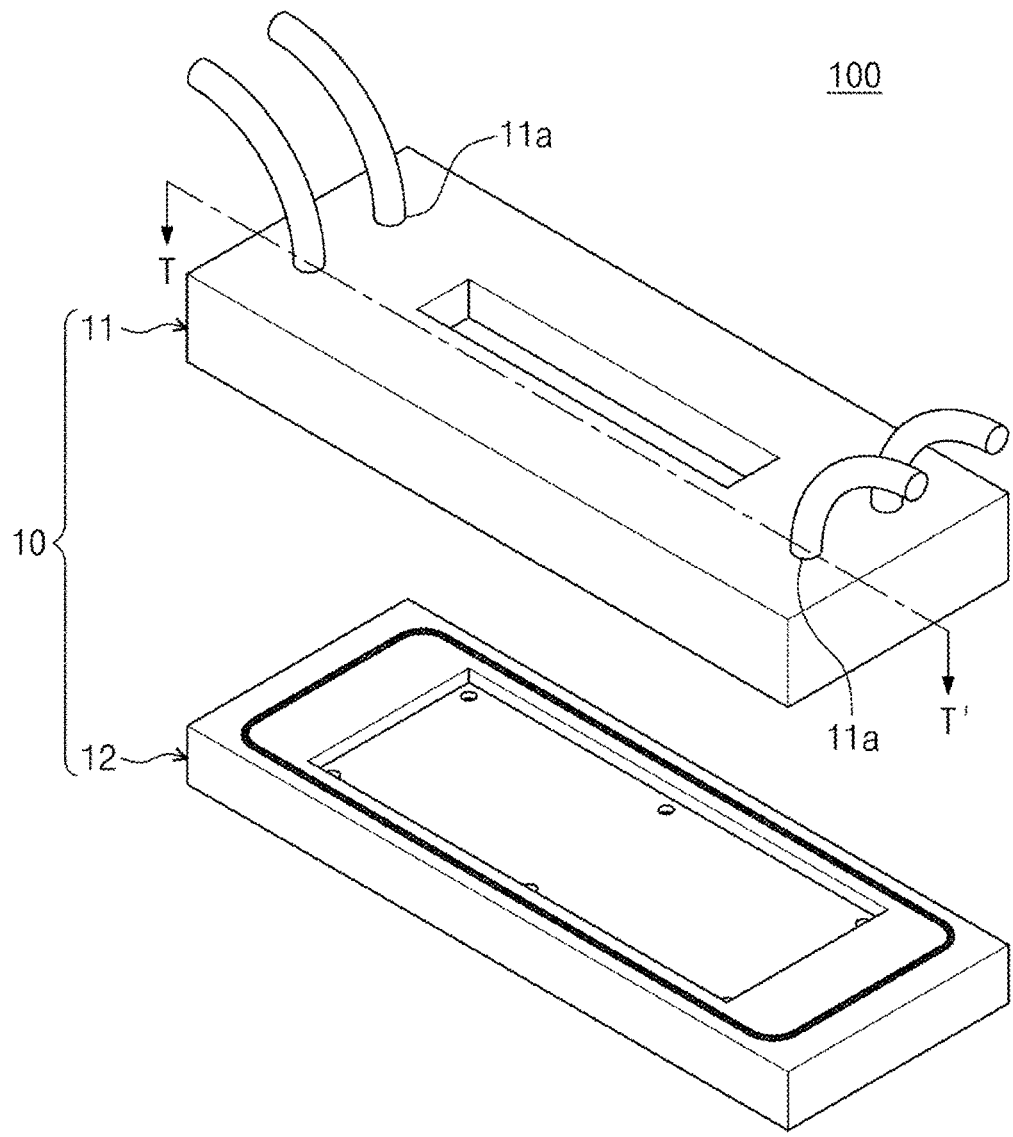
[Fig. 2]

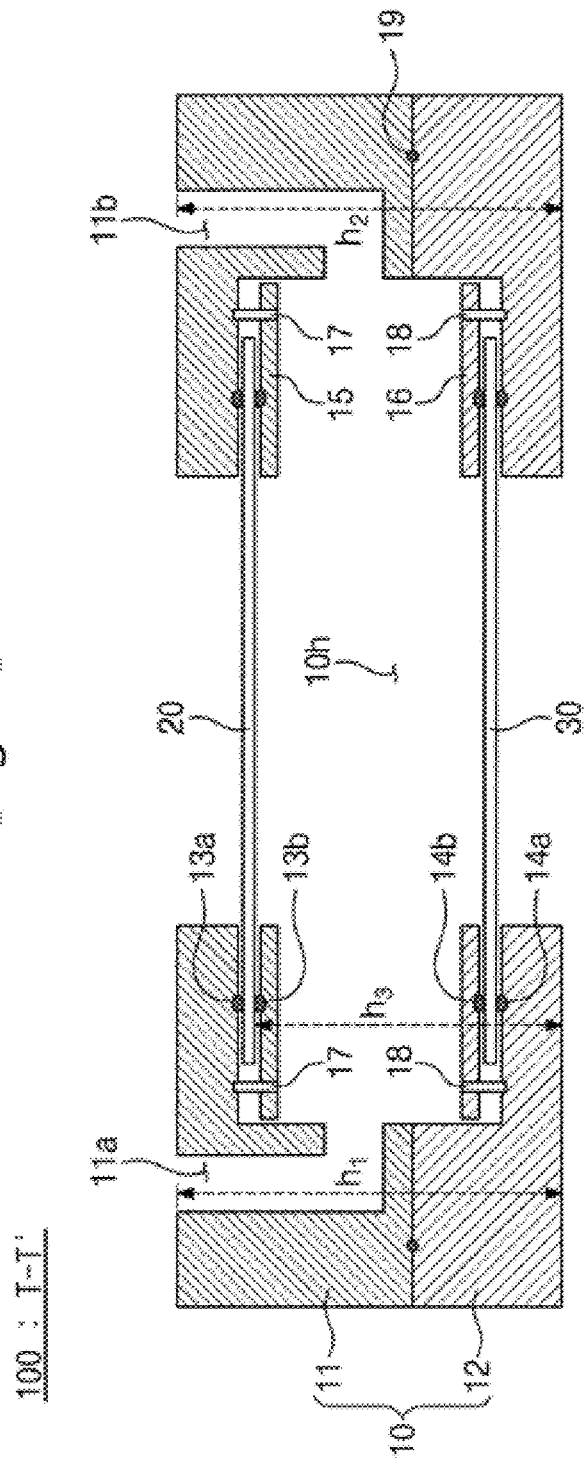
[Fig. 3]

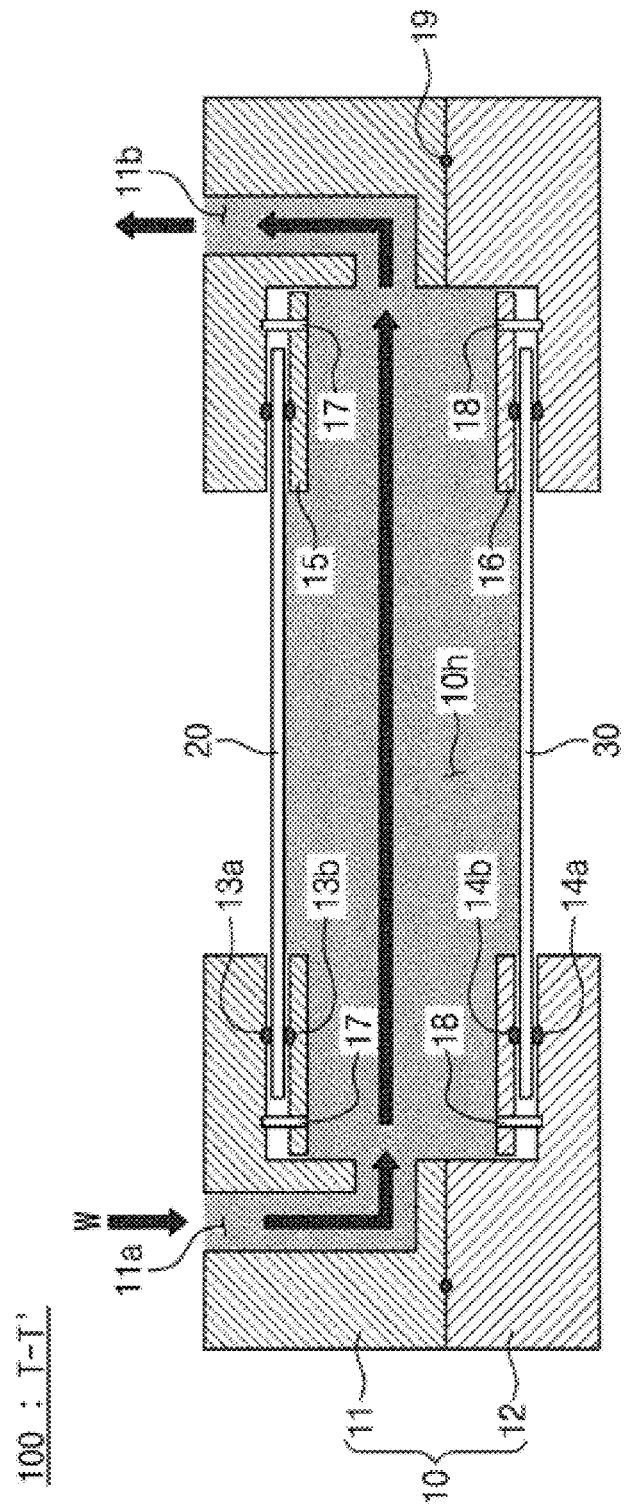

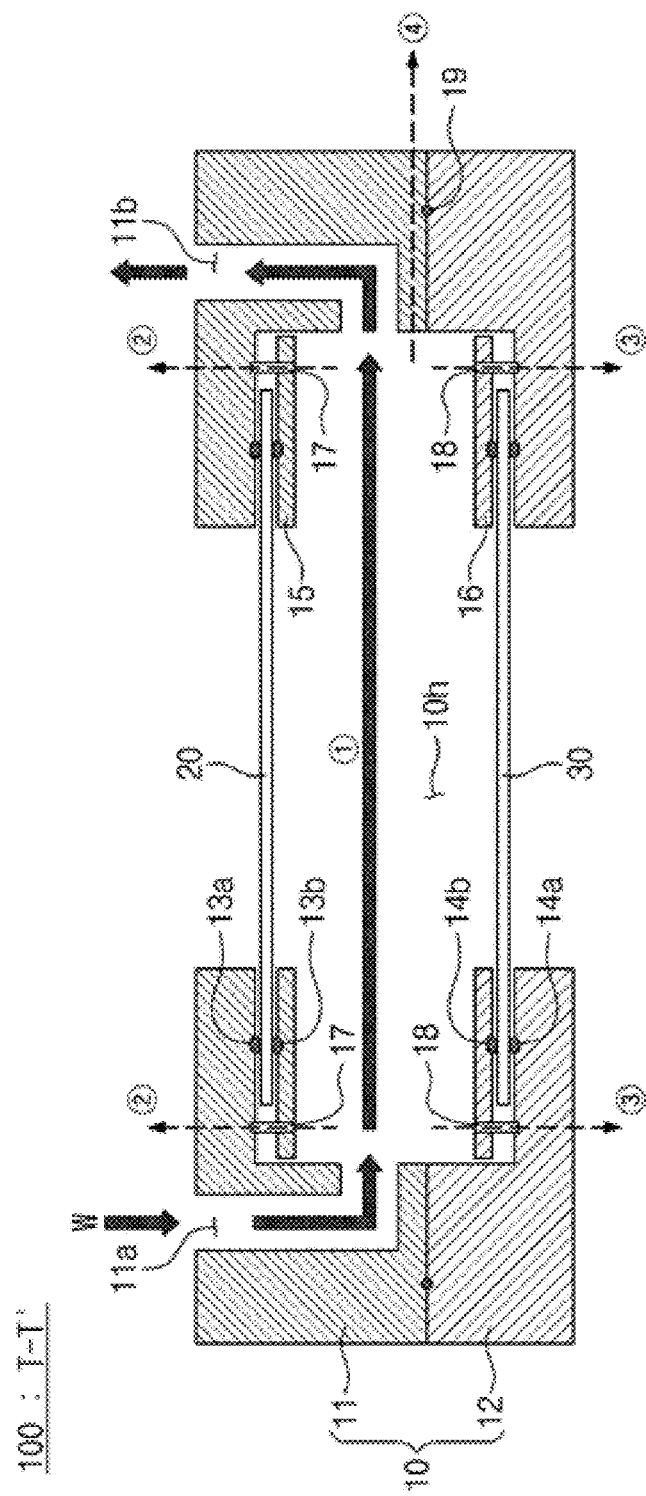

[Fig. 6A]
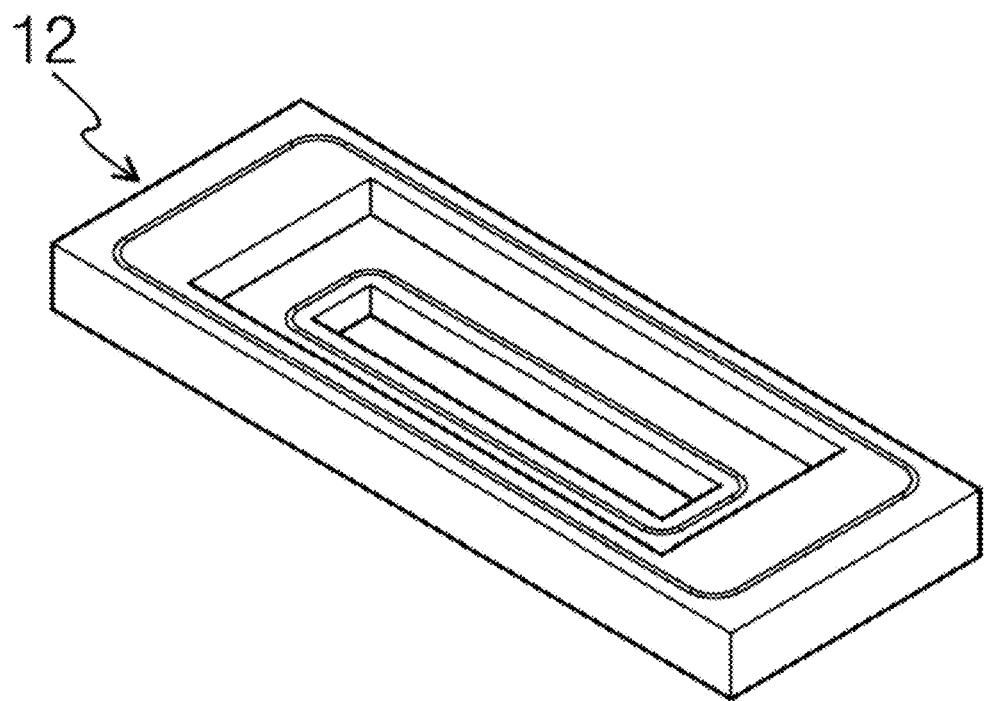

[Fig. 6B]
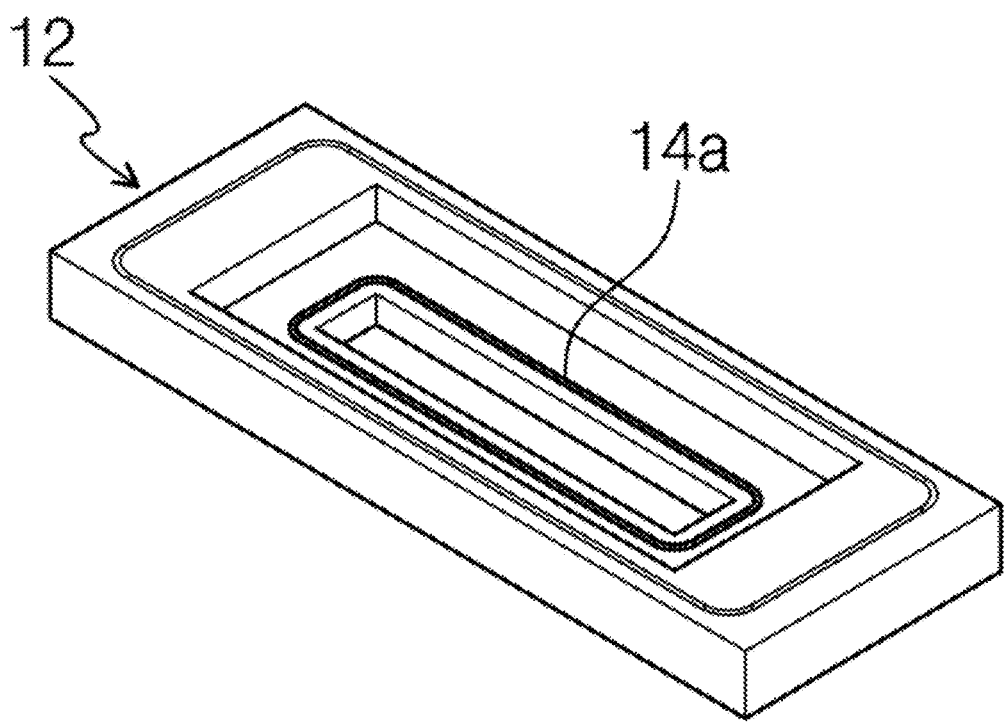

[Fig. 6C]
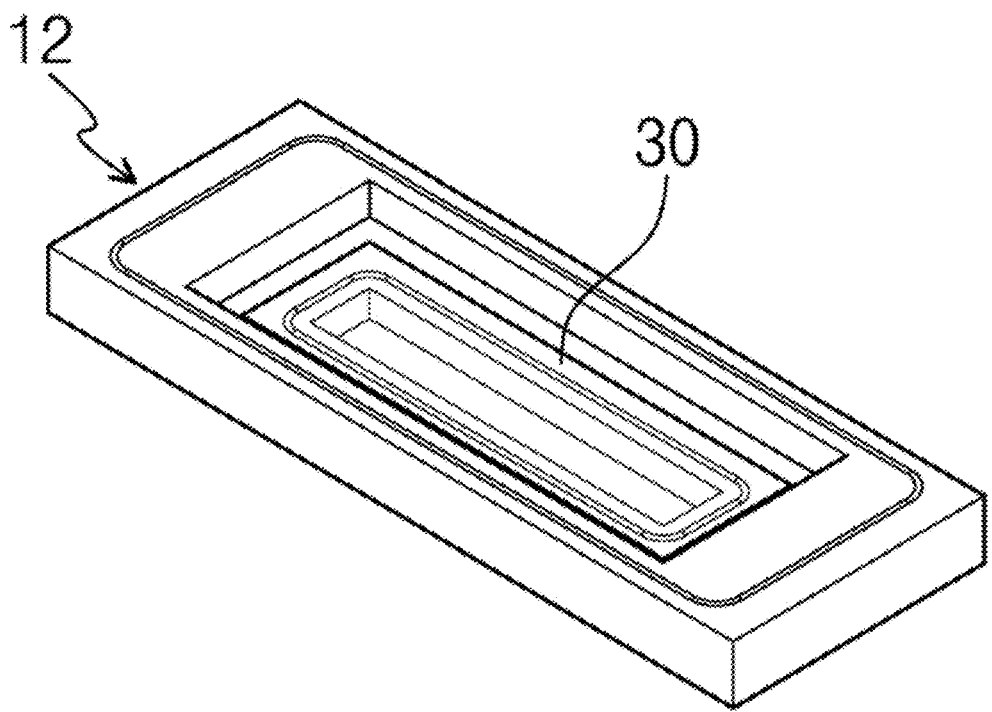

[Fig. 6D]
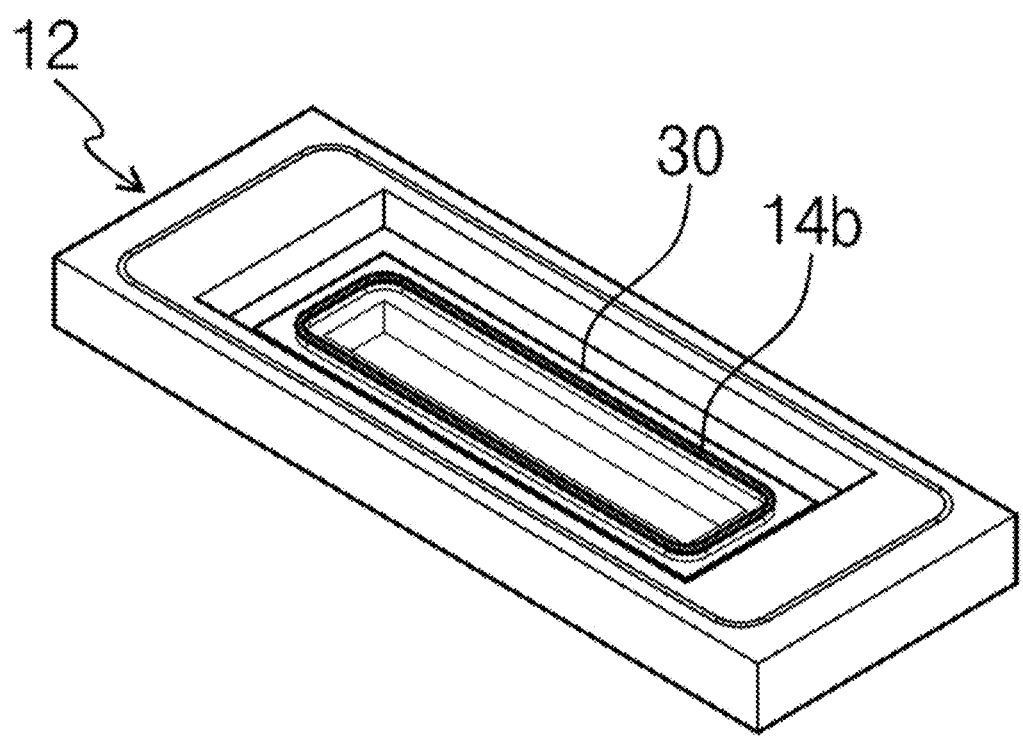

[Fig. 6E]
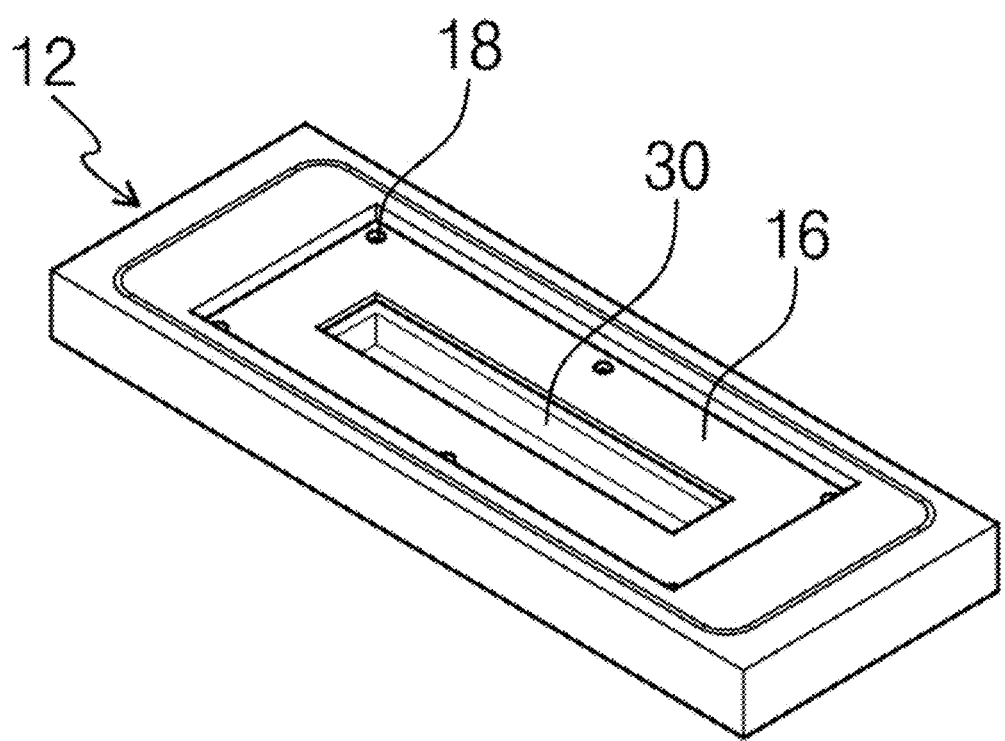

[Fig. 6F]
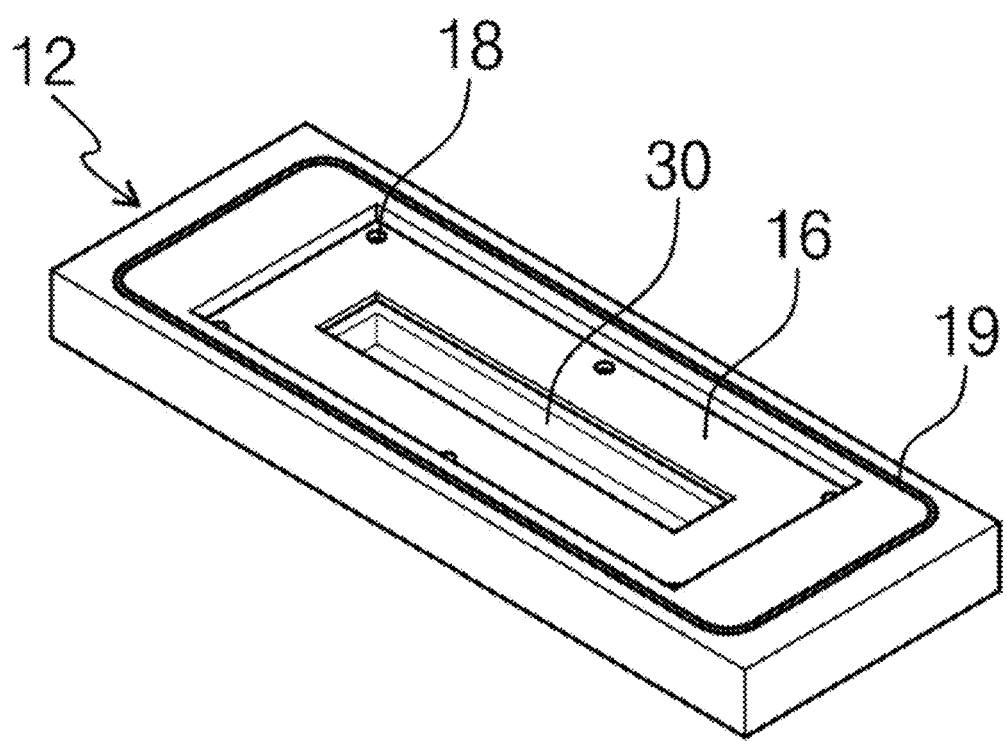

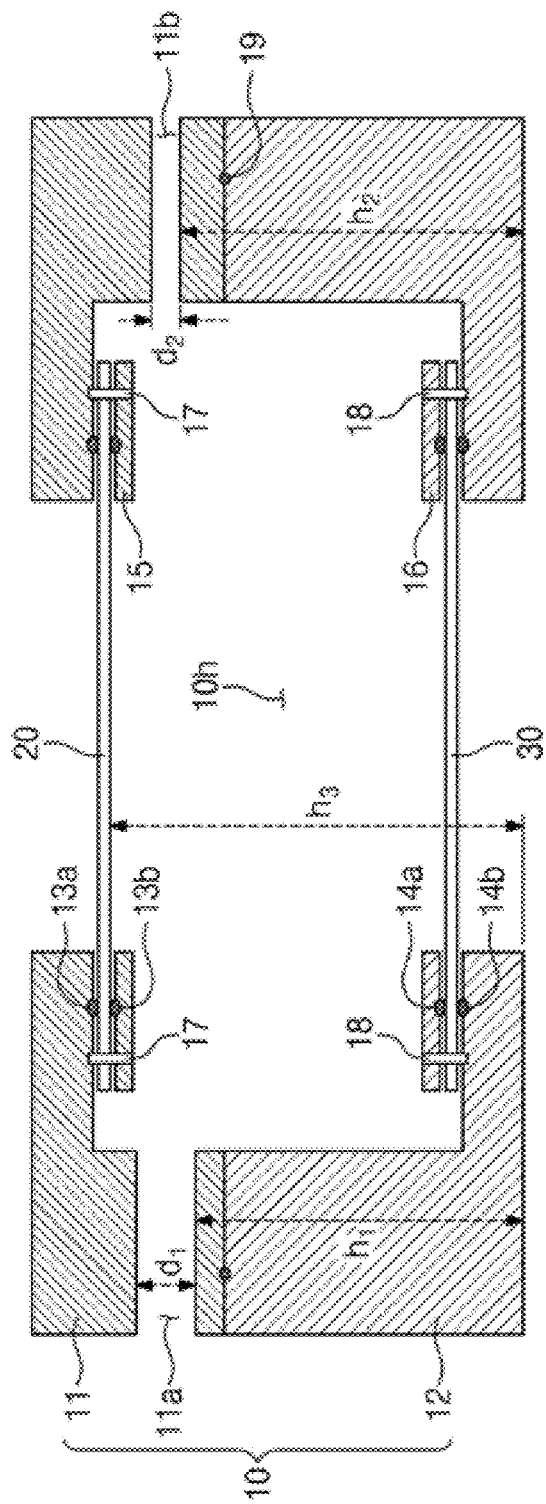

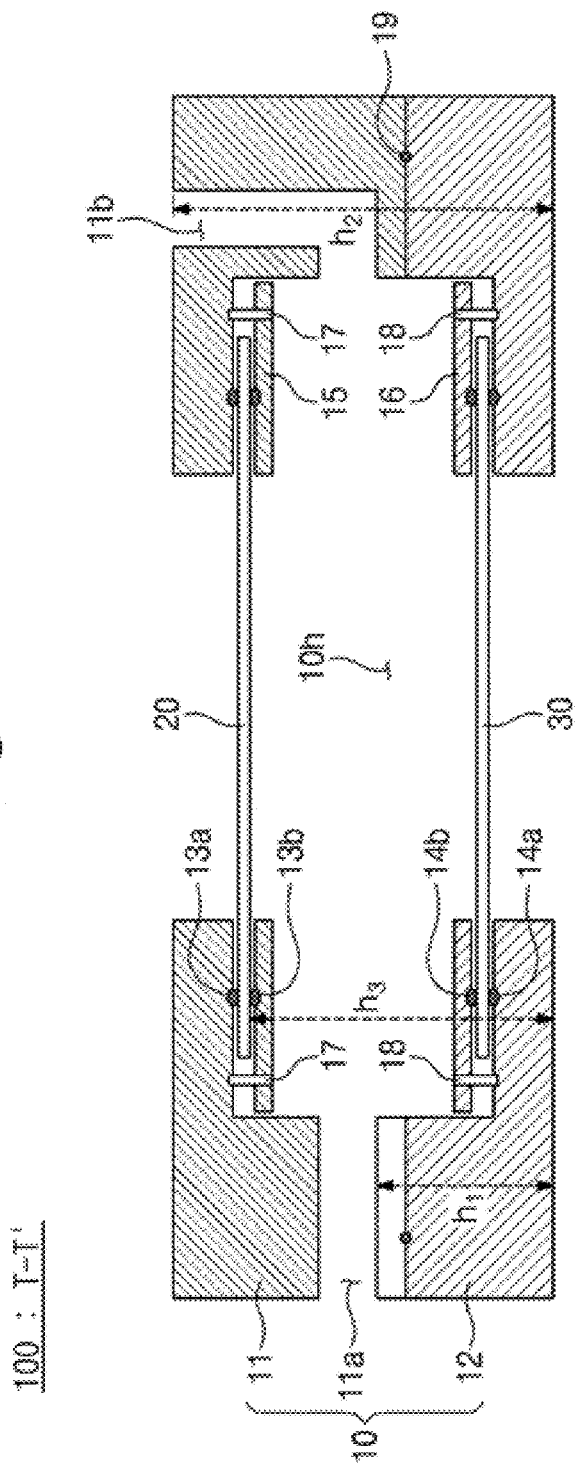

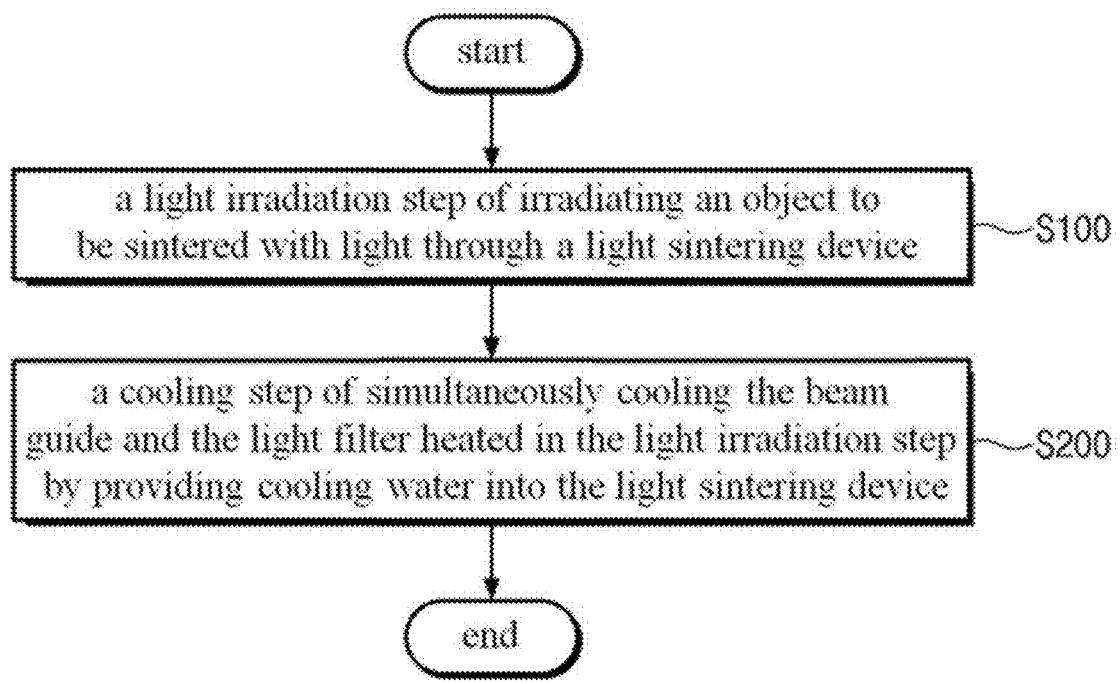

[Fig. 10]
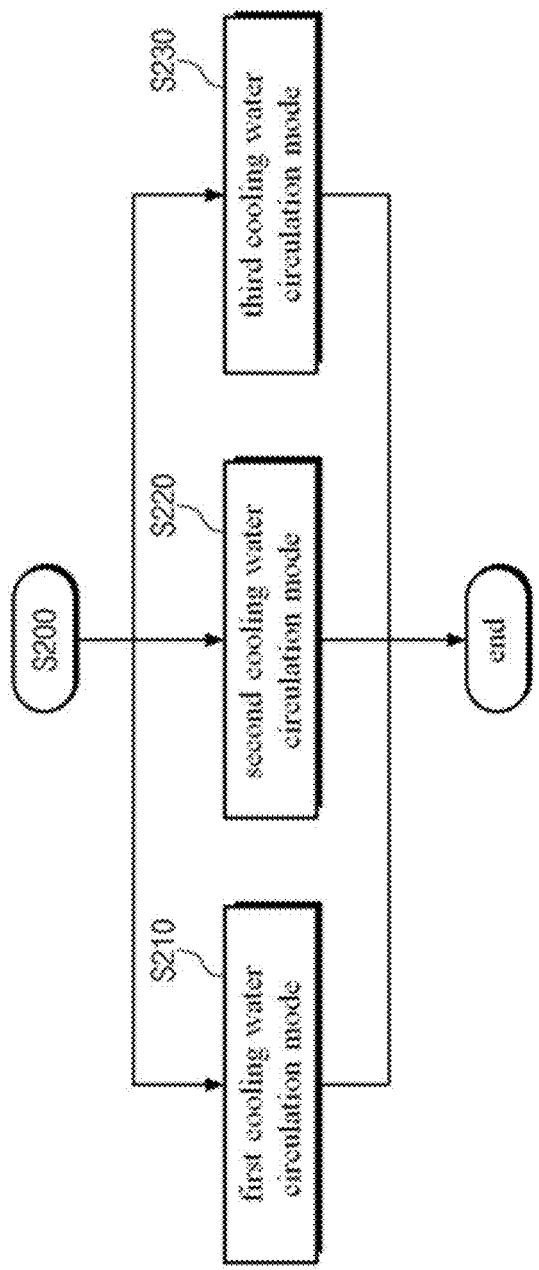

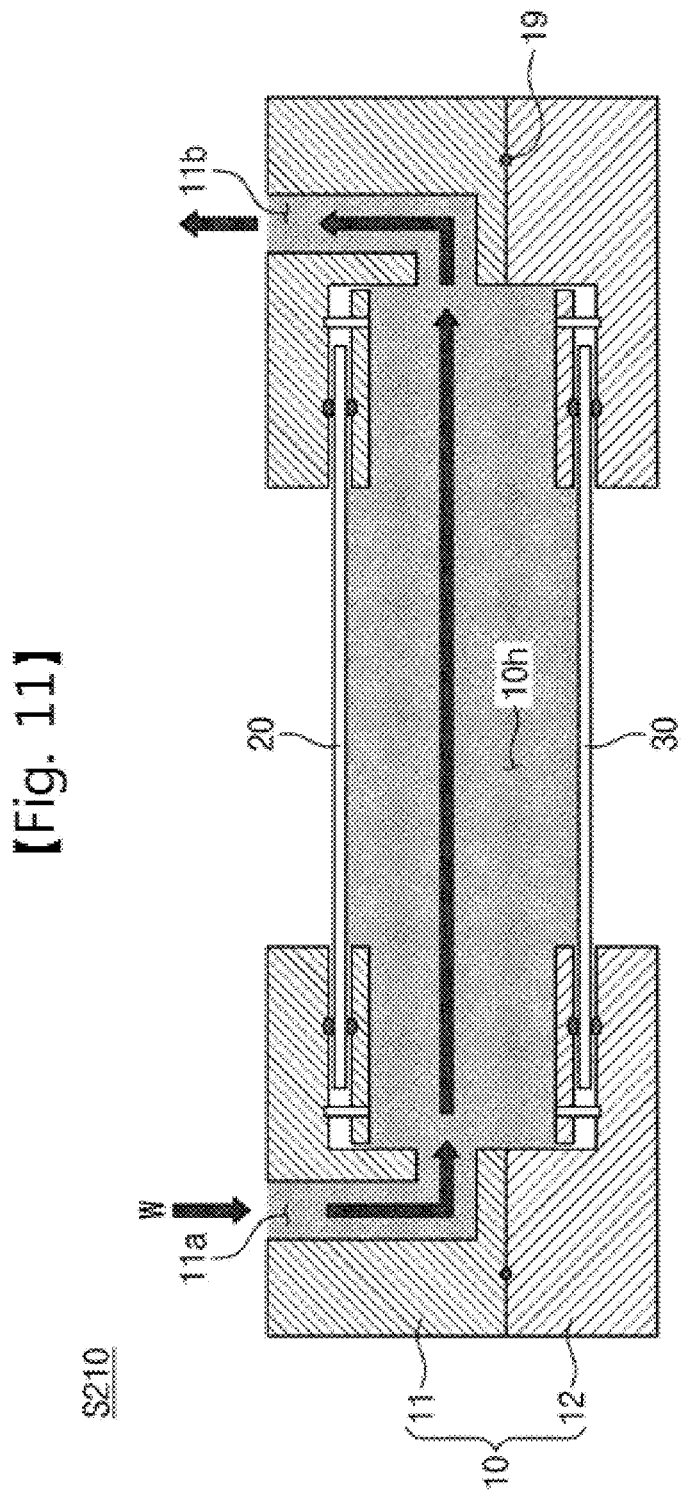

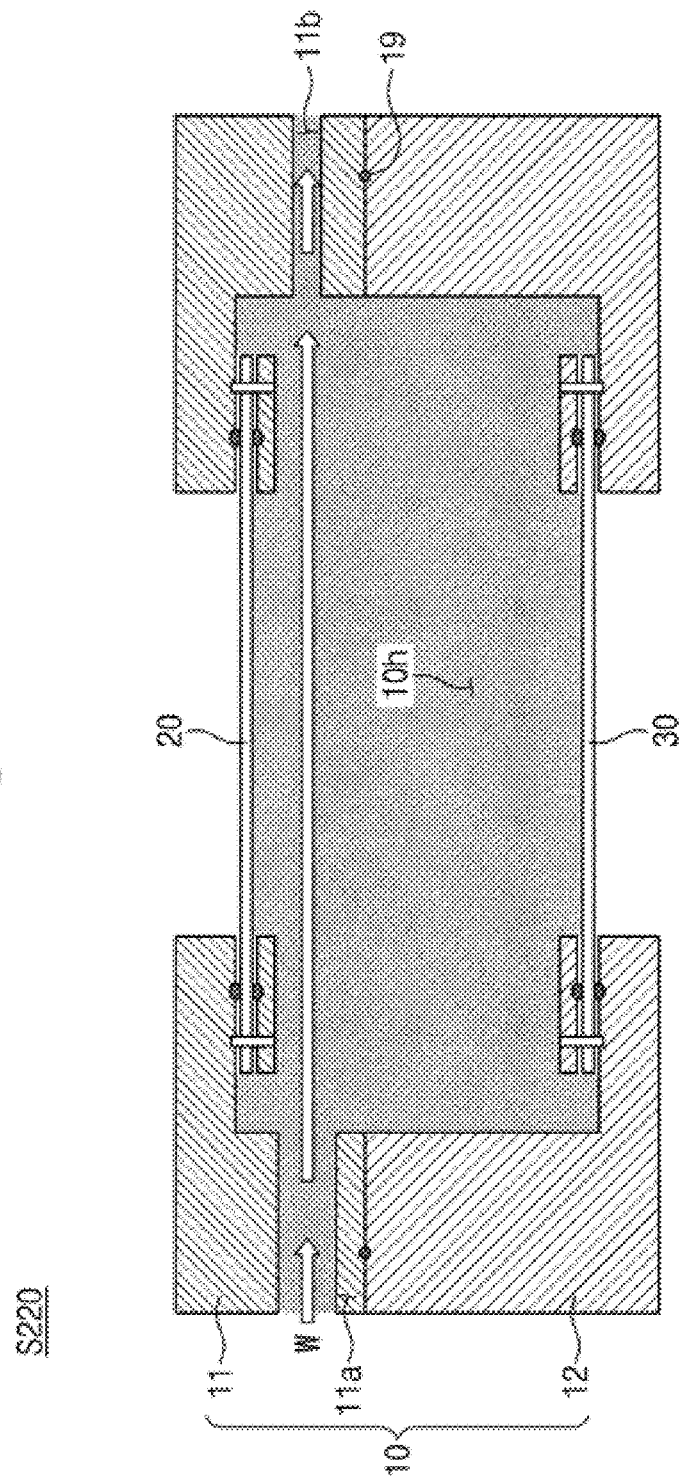

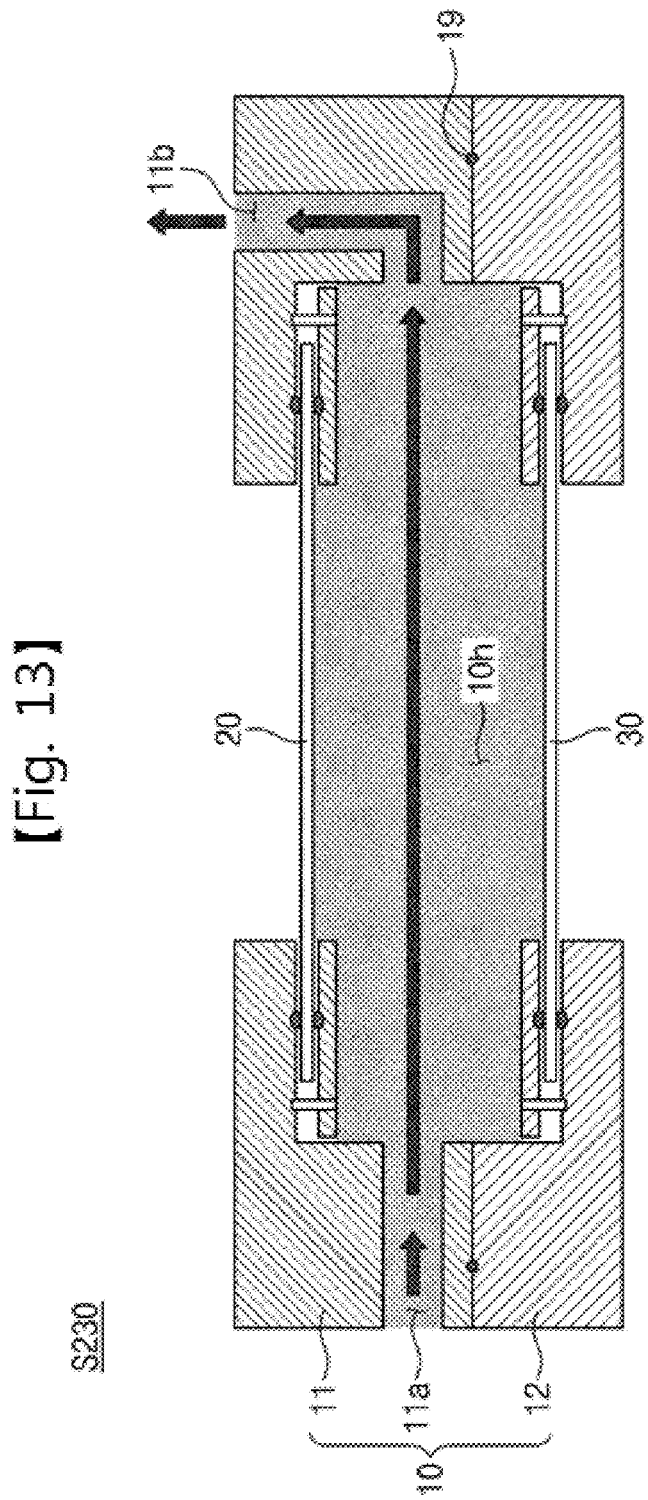

[Fig. 14A]
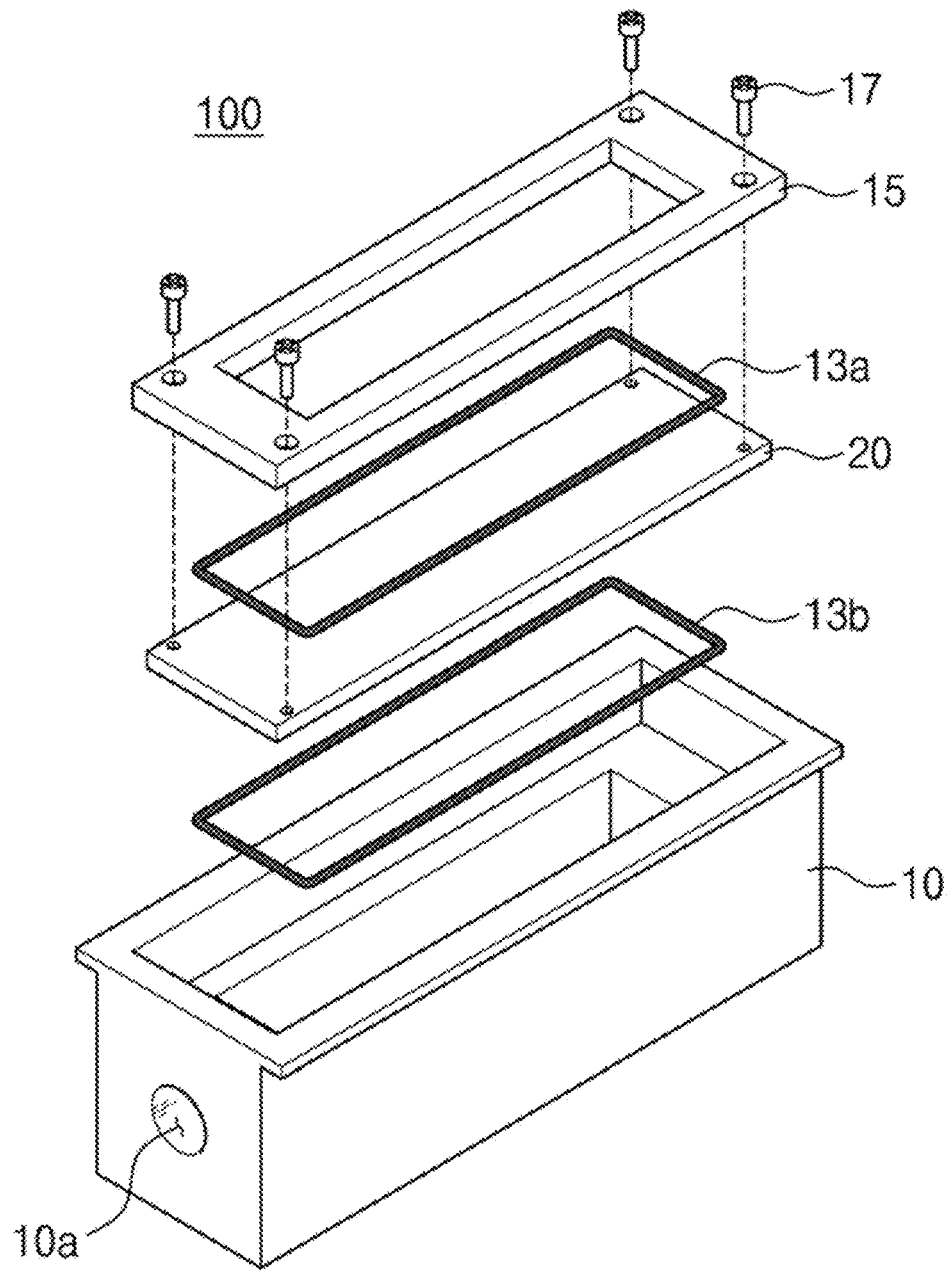

[Fig. 14B]
100
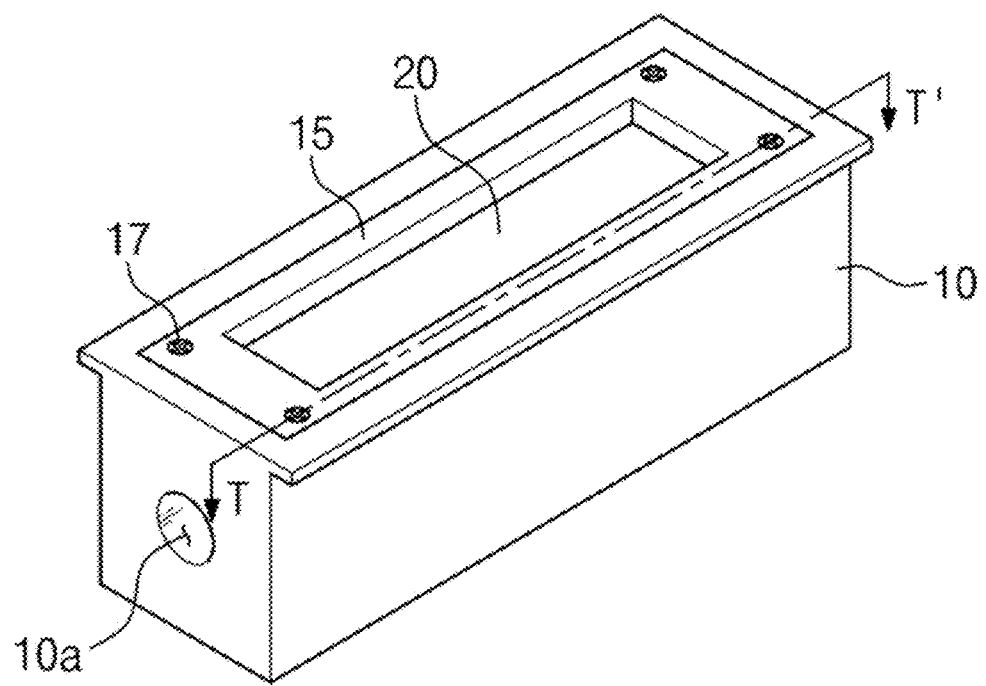

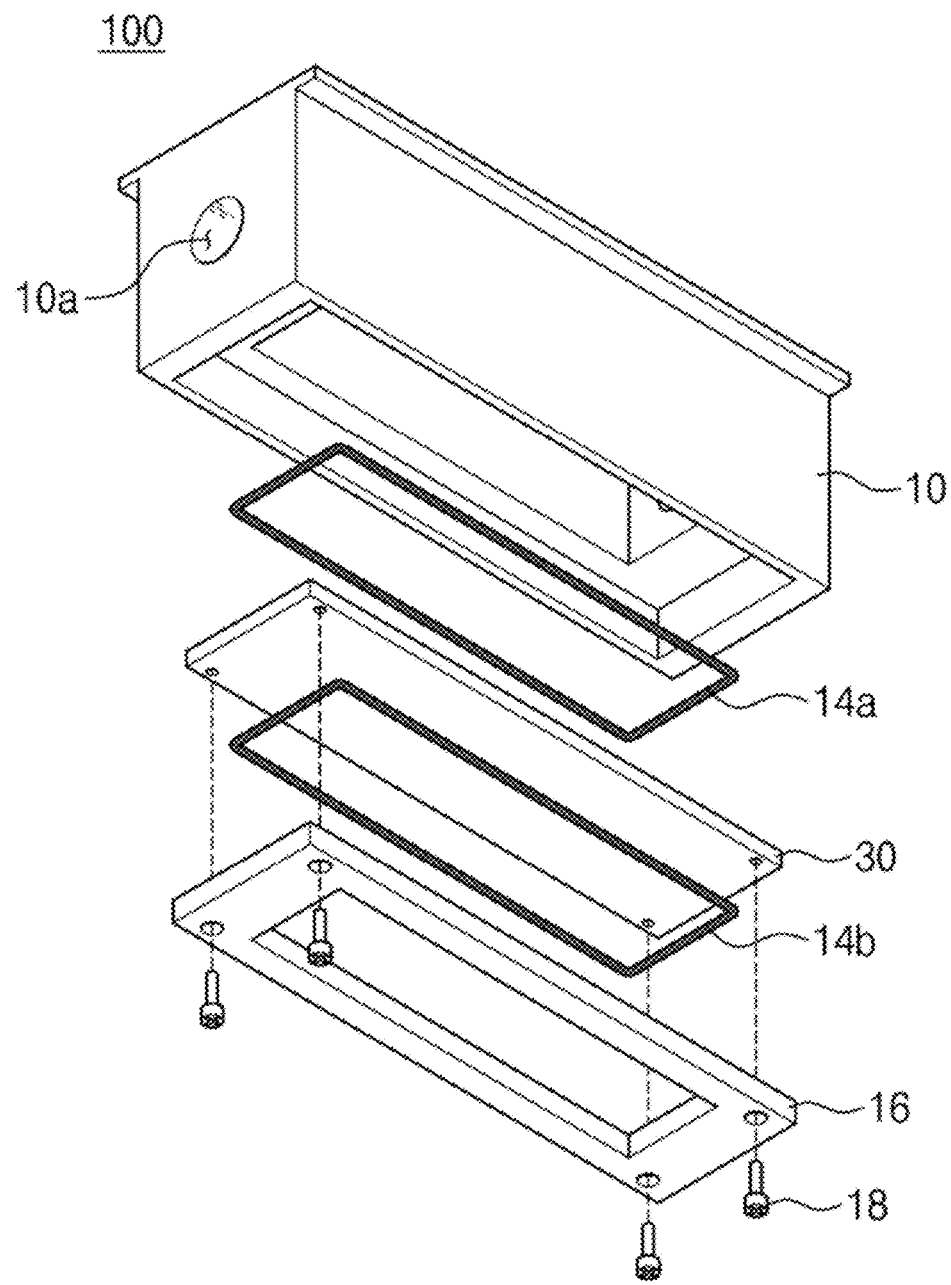

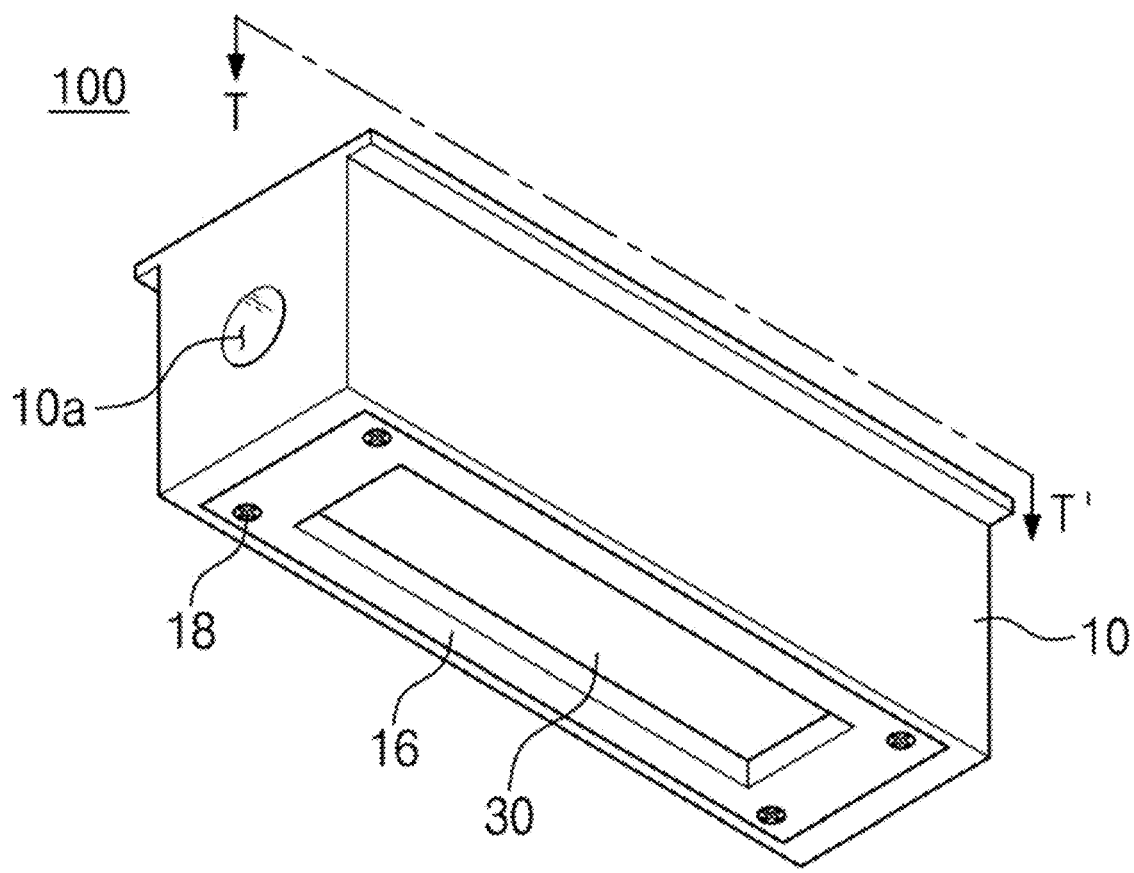
[Fig. 15B]

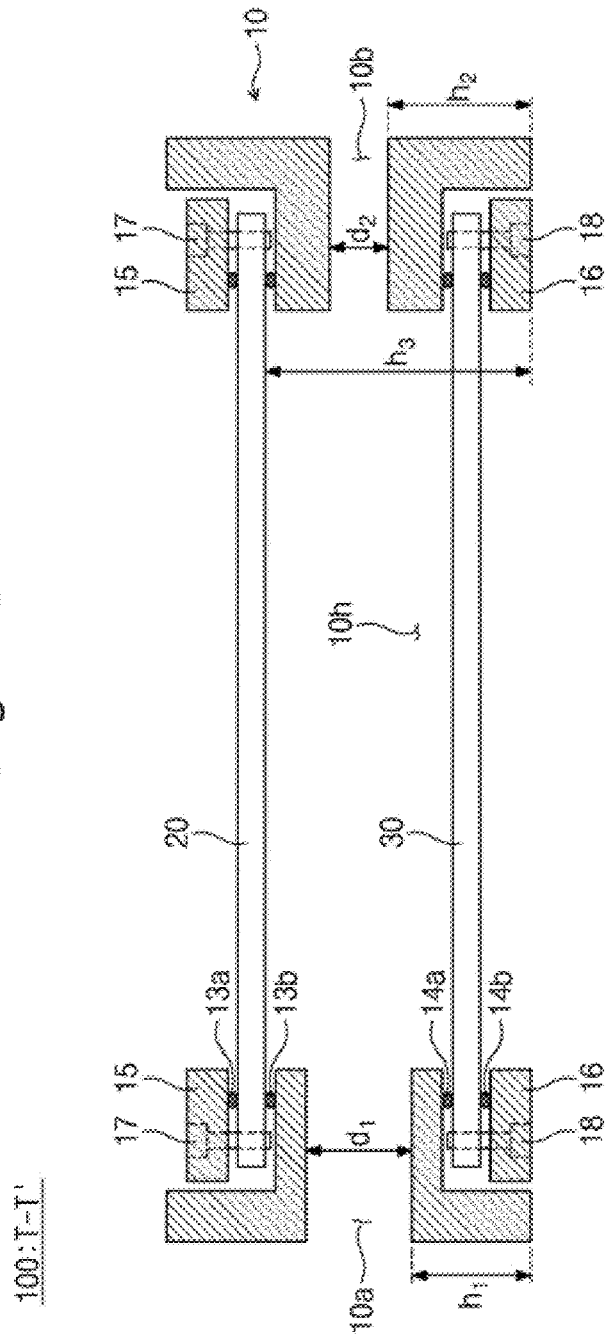

DEVICE FOR LIGHT SINTERING AND COOLING METHOD FOR DEVICE FOR LIGHT SINTERING

TECHNICAL FIELD

The present invention relates to a light sintering device and a cooling method therefor, and more particularly, to a light sintering device for cooling a beam guide and an optical filter together and a cooling method therefor.

BACKGROUND ART

In industry fields, such as semiconductors, displays, solar cells, and LEDs, that lead the modern industry, there is a structure for implementing various functions by forming a very fine electronic pattern on a surface of a glass substrate, a silicon substrate or the like and using the pattern.

Recently, in the above industry fields, there has been a strong need to switch the direction from forming the electronic pattern on a heavy and hard glass substrate or the like to forming the electronic pattern on a light and flexible polymer or plastic substrate, a paper or the like, and various attempts have been made to realize the above need.

In order to form the electronic pattern on a flexible substrate or paper, a method, in which a pattern is formed on a substrate by printing electronics and sintered to form an electronic pattern, has been proposed.

The process of the printing electronics includes three steps of printing, drying, and sintering. The sintering process is a step that significantly exerts an effect on product performance. The sintering signifies to make a functional thin film in a solid form by dissolving nanoparticles, which is a process having a considerable value in the next generation technology fields. A general sintering process is performed by a thermal sintering scheme, a microwave sintering scheme, a laser sintering scheme, or the like. It is difficult to apply the conventional thermal sintering scheme to a flexible substrate that is vulnerable to heat, since the sintering process proceeds in a high-temperature vacuum chamber environment. Since other sintering schemes require long process times and complicated steps, productivity is deteriorated and manufacturing cost is increased.

Accordingly, there is a need to develop various methods and devices that can improve the efficiency of the sintering process.

DISCLOSURE

Technical Problem

The present invention provides a light sintering device having improved light sintering efficiency and a cooling method therefor.

The present invention further provides a device for light sintering and a cooling method therefor to prevent an optical filter from being damaged.

The present invention still further provides a device for light sintering and a cooling method therefor to easily release heat formed inside.

The present invention still further provides a light sintering device and a cooling method therefor to improve a surface plasma effect of an object to be sintered.

The technical problems to be solved by the present invention are not limited to the above.

Technical Solution

In order to solve the above-mentioned technical problems, the present invention provides a light sintering device.

According to one embodiment, the light sintering device includes: a housing having a cooling hollow through which cooling water flows; a beam guide mounted on one side of the housing to form one wall of the cooling hollow, and configured to guide sintering light; and an optical filter mounted on an opposite side of the housing to face the beam guide to form an opposite wall of the cooling hollow, and configured to filter a specific wavelength band of the sintering light.

According to one embodiment, the cooling hollow may be fully filled such that the cooling water come into direct contact with both of the beam guide and the optical filter.

According to one embodiment, the housing may include an inlet for introducing the cooling water into the cooling hollow, and an outlet for discharging the cooling water introduced into the cooling hollow, wherein the inlet and the outlet may have height levels higher than a height level of the beam guide.

According to one embodiment, the housing may include an inlet for introducing the cooling water into the cooling hollow, and an outlet for discharging the cooling water introduced into the cooling hollow, wherein the inlet and the outlet may be arranged at a height level between the beam guide and the optical filter, and the outlet may have a sectional area smaller than a sectional area of the inlet.

According to one embodiment, the housing may include an inlet for introducing the cooling water into the cooling hollow, and an outlet for discharging the cooling water introduced into the cooling hollow, wherein the inlet is arranged at a height level between the beam guide and the optical filter, and the outlet may have a height level higher than a height level of the beam guide.

According to one embodiment, the light sintering device may include at least one of: a first beam guide buffer ring provided between an inner surface of the housing and one surface of the beam guide to buffer a space between the inner surface of the housing and the one surface of the beam guide, and a first optical filter buffer ring provided between the inner surface of the housing and one surface of the optical filter to buffer a space between the inner surface of the housing and the one surface of the optical filter.

According to one embodiment, the light sintering device may include at least one of: a beam guide fixing plate for covering at least a part of the beam guide to fix the beam guide, and reflecting the sintering light, and an optical filter fixing plate for covering at least a part of the optical filter to fix the optical filter and reflecting the sintering light.

According to one embodiment, the light sintering device may include at least one of: a beam guide fastening portion configured to fasten parts of the beam guide fixing plate and the housing from a position beyond an extension length of the beam guide; and an optical filter fastening portion configured to fasten parts of the optical filter fixing plate and the housing from a position beyond an extension length of the optical filter.

According to one embodiment, heat of the cooling water in the cooling hollow may be dissipated to an outside through at least one of: a first auxiliary heat dissipation path for dissipating the heat to the outside through the housing from the beam guide fixing plate by way of the beam guide fastening portion; and a second auxiliary heat dissipation path for dissipating the heat to the outside through the housing from the optical filter fixing plate by way of the optical filter fastening portion.

According to one embodiment, the housing may include a first housing to which the beam guide is mounted to form one wall of the cooling hollow, and a second housing to which the optical filter is mounted to form an opposite wall of the cooling hollow.

In order to solve the above-mentioned technical problems, the present invention provides the cooling method for the light sintering device.

According to one embodiment, the cooling method for the light sintering device may include: a light irradiation step of irradiating an object to be sintered with light through an optical filter for filtering sintering light from a beam guide for guiding the sintering light; and a cooling step of simultaneously cooling the beam guide and the light filter heated in the light irradiation step by providing the cooling water to fill the cooling hollow defined by the beam guide as one wall and the optical filter as the other wall.

According to one embodiment, the cooling hollow may be fully filled with the cooling water.

According to one embodiment, in the cooling step, the cooling hollow may be fully filled with the cooling water through one of: a first cooling water circulation mode in which the cooling water is introduced at a higher level than the beam guide and discharged at a height level higher than the beam guide, a second cooling water circulation mode in which the cooling water is introduced at a height level between the beam guide and the optical filter and discharged at the height level between the beam guide and the optical filter through a sectional area smaller than an introduced sectional area, and a third cooling water circulation mode in which the cooling water is introduced at a height level between the beam guide and the optical filter and discharged at a height level higher than the beam guide.

Advantageous Effects

The light sintering device according to the embodiments of the present invention includes: a housing having a cooling hollow through which cooling water flows; a beam guide mounted on one side of the housing to form one wall of the cooling hollow, and configured to guide sintering light; and an optical filter mounted on an opposite side of the housing to face the beam guide to form an opposite wall of the cooling hollow, and configured to filter a specific wavelength band of the sintering light.

As the temperature of the optical filter rises to a high temperature by the sintered light during the sintering process, the coating of the optical filter may be delaminated. As the cooling water is provided to come into contact with the optical filter, the coating may be prevented from being delaminated, so that the surface plasma effect of the object to be light-sintered may be improved.

In addition, the cooling hollow may be fully filled such that the cooling water come into direct contact with both of the beam guide and the optical filter. Accordingly, when the cooling water is filled in the cooling hollow, the beam guide and the optical filter may be cooled together. In addition, when the cooling hollow is fully filled with the cooling water, steam and bubbles from the cooling water may be prevented even when a temperature of the cooling water is increased by the sintering light. As a result, when the steam is prevented, a path distortion of the sintering light can be minimized, and when the bubbles are prevented, a damage to the housing, the beam guide, and the optical filter due to bubble explosion can be minimized.

DESCRIPTION OF DRAWINGS

FIG. 1 is a schematic view of a light sintering system including a light sintering device according to the embodiment of the present invention.

FIG. 2 is a perspective view of a light sintering device according to a first embodiment of the present invention.

FIG. 3 is a sectional view in a T-T' direction of the light sintering device according to the first embodiment of the present invention shown in FIG. 2.

FIG. 4 is a view showing that cooling water is provided into the light sintering device according to the first embodiment of the present invention.

FIG. 5 is a view showing an operating state of the light sintering device according to the first embodiment of the present invention.

FIGS. 6A, 6B, 6C, 6D, 6E and 6F are views showing a part of a manufacturing method of the light sintering device according to the first embodiment of the present invention.

FIG. 7 is a sectional view of a light sintering device according to a second embodiment of the present invention.

FIG. 8 is a sectional view of a light sintering device according to a third embodiment of the present invention.

FIG. 9 is a flow chart explaining a cooling method for the light sintering device according to the embodiment of the present invention.

FIG. 10 is a flowchart specifically explaining step S200 illustrated in FIG. 9.

FIG. 11 is a view showing a first cooling water circulation mode in the cooling method for the light sintering device according to the embodiment of the present invention.

FIG. 12 is a view showing a second cooling water circulation mode in the cooling method for the light sintering device according to an embodiment of the present invention.

FIG. 13 is a view showing a third cooling water circulation mode in the cooling method for the light sintering device according to an embodiment of the present invention.

FIGS. 14A and 14B are views showing a light sintering device according to a fourth embodiment of the present invention.

FIGS. 15A and 15B are views showing a light sintering device according to a fourth embodiment of the present invention.

FIG. 16 is a sectional view of the light sintering device 100 according to the fourth embodiment of the present invention.

MODE FOR INVENTION

Hereinafter, preferred embodiments of the present invention will be described in detail with reference to the accompanying drawings. However, the technical idea of the present invention is not limited to the exemplary embodiments described herein and may be embodied in other forms. Further, the embodiments disclosed thoroughly and completely herein may be provided such that the idea of the present invention can be fully understood by those skilled in the art.

Although terms such as first, second and third are used herein to describe various components in various embodiments of the present specification, the components should not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it should be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

Prior to the description of the light sintering device according to the embodiments of the present invention, a light sintering system including the light sintering device will be described briefly.

FIG. 1 is a schematic view of a light sintering system including a light sintering device according to the embodiment of the present invention.

Referring to FIG. 1, the light sintering system including the light sintering device according to the embodiments of the present invention may include a light sintering device 100 and a control unit 200. The light sintering system may sinter an object S to be sintered. Hereinafter, each component will be described.

The light sintering device 100 may irradiate sintering light L such as xenon lamp light. To this end, the light sintering device 100 may include a xenon lamp. The xenon lamp refers to a lamp that emits light caused by electric discharge generated in xenon gas, and may sinter the object S by generating extreme short-wave white light having a broad spectrum of a wavelength band between 60 nm and 2.5 mm.

The light sintering device 100 may further include at least one of an infrared lamp and an ultraviolet lamp. The infrared lamp may improve the efficiency of sintering, because ultraviolet light cuts off links that connect polymers contained in the ink when the object S is metal nano ink. In addition, the infrared lamp may function to dry the object S.

The light sintering device 100, as shown in FIG. 3, may further include a beam guide 20 for guiding xenon lamp light to the object S, and an optical filter 30 that selectively transmits a specific spectrum of the sintering light L to improve light sintering efficiency.

The control unit 200 may control the light sintering device 100 as well as a power supply unit (not shown) and a cooling water circulation pump (not shown). The control unit 200 may control the xenon lamp of the light sintering device 100 through the power supply unit. In addition, the control unit 200 may cool the light sintering device filter 100, such as the beam guide 20 and the optical filter 30, through the cooling water circulation pump.

The object S to be sintered may denote an object material to be light-sintered, such as fine metal particles and precursors patterned on a plastic, film, paper, glass, substrate, or the like. For example, the object S to be sintered may include metal such as copper, iron, molybdenum, nickel, aluminum, gold, platinum, and silver as well as ceramic such as titanium oxide, lithium cobalt oxide, and silicon oxide. The object S to be sintered may have a nano or micro size. In this case, the surface area ratio of the particles becomes large, and thus a high optical absorption rate may be provided.

In addition, for example, the object S to be sintered may be metal nano ink printed on a substrate, and may be formed as an electrode of an electronic apparatus, such as a solar cell, a semiconductor, or a display, after drying and sintering steps. However, the object S may not be limited to the metal nano ink for forming the electrode.

According to one embodiment, the object S to be sintered may be fixed during the sintering process, or may be sintered while moving in a roll-to-roll way as shown in FIG. 1.

As described above, the light sintering device 100 may include the optical filter 30 to filter a specific wavelength band of light. The optical filter 30 may be manufactured through a predetermined heat treatment, in a state where the optical filter is coated with a light filtering material on a light-transmitting substrate such as quartz. When a temperature of the optical filter 30 rises to a high temperature due to the sintering light L, the coating light filtering material may be delaminated. For example, due to the sintering light L, the temperature of the optical filter 30 may be raised to the temperature or higher than the heat treatment temperature for coating using the optical filtering material. Accordingly the coating may be delaminated. In this case, the problem may be caused in which the optical filter 30 hinders the optical spectrum reliability of the sintering light L. Thus, the optical sintering device filter 100 according to the embodiments of the present invention provides a configuration for cooling the optical filter. Hereinafter, the light sintering device 100 according to the embodiments of the present invention will be described in detail with reference to FIGS. 2 to 5.

FIG. 2 is a perspective view of a light sintering device according to a first embodiment of the present invention. FIG. 3 is a sectional view in a T-T' direction of the light sintering device according to the first embodiment of the present invention shown in FIG. 2. FIG. 4 is a view showing that cooling water is provided into the light sintering device according to the first embodiment of the present invention.

Referring to FIGS. 2 and 3, the light sintering device 100 according to the first embodiment may include at least one of a housing 10, a beam guide 20, and an optical filter 30. Hereinafter, each component will be described.

Housing

A housing 10 may have an inlet 11a, an outlet 11b, and a cooling hollow 10h. The inlet 11a may provide a passage through which cooling water flows into the cooling hollow 10h. The outlet 11b may provide a passage for discharging the cooling water flowing into the cooling hollow 10h to the outside. According to one embodiment, the housing 10 may be metal having a high heat transfer rate. For example, the housing 10 may be formed of aluminum.

The cooling hollow 10h may be an inner space of the housing 10 provided with the cooling water. The cooling hollow 10h may be defined by one surface of the beam guide 20, one surface of the optical filter 30 and one surface of the housing 10. More specifically, an upper surface of the cooling hollow 10h may be defined by the one surface of the beam guide 20, a lower surface of the cooling hollow 10h may be defined by the one surface of the optical filter 30, and a side surface of the cooling hollow 10h may be defined by the one surface of the housing 10. Accordingly, as shown in FIG. 4, when the cooling water W is introduced to the cooling hollow 10h, the cooling water may come into direct contact with both of the beam guide 20 and the optical filter 30 so that the beam guide 20 and the optical filter 30 may be cooled together.

According to one embodiment, the housing 10 may include a first housing 11 and a second housing 12. The first housing 11 and the second housing 12 are coupled to each other so that the cooling hollow 10h may be formed therein. According to one embodiment, the first housing 11 may be disposed on a top of the second housing 12. In this case, a xenon lamp may be disposed over the first housing 11, and an object S to be sintered may be disposed under the second housing 12.

Meanwhile, according to one embodiment, when the housing 10 includes the first and second housings 11 and 12, the inlet 11*a* and the outlet 11*b* may be arranged on a top of the first housing 11.

Beam Guide

The beam guide 20 may be mounted on one side of the housing 10 to form one wall of the cooling hollow 10*h*. According to one embodiment, the beam guide 20 may be mounted on the first housing 11.

The beam guide 20 may guide light to sinter the object S. In other words, the beam guide 20 may provide a path of the light such that the light irradiated from the xenon lamp is easily provided on the object S. For example, the beam guide 20 may be quartz.

Optical Filter

The optical filter 30 may be mounted on the other side of the housing 10 to face the beam guide 20 so as to form the other wall of the cooling hollow 10*h*. According to one embodiment, the optical filter 30 may be mounted on the second housing 12.

The optical filter 30 may filter a specific wavelength band of the light that sinters the object S. In other words, the optical filter 30 may filter the wavelength band capable of maximizing a surface plasma effect occurring when the object S is light-sintered and provide the filtered wavelength band to the object S. For example, when the light is white light, the optical filter 30 may filter light having a wavelength band of 400 nm to 600 nm. Specifically, when the light is white light, the optical filter 30 may provide only the light having a wavelength band of 400 nm to 600 nm to the object S.

According to one embodiment, a height level h1 of the inlet 11*a* and a height level h2 of the outlet 11*b* may be higher than a height level h3 of the beam guide 20. The height level h1 of the inlet may be defined as a height from a bottom surface of the housing 10 to the inlet 11*a*. The height level h2 of the outlet may be defined as a height from the bottom surface of the housing 10 to the outlet 11*b*. The height level h3 of the beam guide 20 may be defined as a height from the bottom surface of the housing 10 to the beam guide 20.

Referring to FIG. 4, the cooling water W may be provided to the inner hollow 10*h* through the inlet 11*a*, and discharged to the outside of the housing 10 through the outlet 11*b*.

Since the height level h1 of the inlet 11*a* and the height level h2 of the outlet 11*b* are higher than the height level h3 of the beam guide 20, the cooling hollow 10*h* may be fully filled with the cooling water W. In other words, the cooling hollow 10*h* may be fully filled such that the cooling water W comes into direct contact with both of the beam guide 20 and the optical filter 30. Accordingly, when the cooling water W is filled in the cooling hollow 10*h*, the beam guide 20 and the optical filter 30 may be cooled together. In addition, when the cooling hollow 10*h* is fully filled with the cooling water W, steam and bubbles may be minimally generated from the cooling water W even when a temperature of the cooling water W is increased by the sintering light L.

In contrast, when the cooling hollow 10*h* is not fully filled with the cooling water W, the temperature of the cooling water W may be raised and boiled while the light is irradiated. When the boiling phenomenon continues, steam and bubbles may be generated. When the bubbles are generated from the cooling water W and the generated bubbles explode on a surface of the housing 10, the beam guide 20, or the optical filter 30, the housing 10, the beam guide 20, or the optical filter 30 may be damaged. In addition, when the steam is generated from the cooling water W, the sintering light L may be scattered or absorbed by the steam, so that the sintering light may be easily provided to the object S. Accordingly, the efficiency of the sintering process may be deteriorated.

The above-mentioned light sintering device 100 according to the embodiments of the present invention may further include fixing plates 15 and 16, fastening portions 17*a*, 17*b*, 18*a*, and 18*b*, and buffer rings 13*a*, 13*b*, 14*a*, and 14*b*, such that the beam guide 20 and the optical filter 30 may be stably arranged. Hereinafter, each component will be described.

Fixing Plate

Referring back to FIG. 3, the light sintering device 100 may further include a beam guide fixing plate 15 and an optical filter fixing plate 16. According to one embodiment, the beam guide fixing plate 15 may be included and the optical filter fixing plate 16 may be included.

The beam guide fixing plate 15 may be disposed to one side of the beam guide 20, for example, under the beam guide 20. In another aspect, the beam guide 20 may be disposed between the first housing 11 and the beam guide fixing plate 15. The beam guide fixing plate 15 may provide a function for fixing the beam guide 20 to an inner surface of the first housing 11. For example, the beam guide fixing plate 15 may provide a function for fixing the beam guide 20 to the inner surface of the first housing 11 by covering at least a part of an outer peripheral surface of the beam guide 20.

The optical filter fixing plate 16 may be disposed to one side of the optical filter 30, for example, over the optical filter 30. In another aspect, the optical filter 30 may be disposed between the second housing 12 and the optical filter fixing plate 16. The optical filter fixing plate 16 may provide a function for fixing the optical filter 30 to an inner surface of the second housing 12. For example, the optical filter fixing plate 15 may provide a function for fixing the optical filter 30 to an inner surface of the second housing 12 by covering at least a part of an outer peripheral surface of the optical filter 30.

According to one embodiment, the beam guide fixing plate 15 and the optical filter fixing plate 16 may reflect the sintering light L. To this end, surfaces of the beam guide fixing plate 15 and the optical filter fixing plate 16 may have high reflectivity. For example, the beam guide fixing plate 15 and the optical filter fixing plate 16 may be formed of aluminum to provide the high reflectivity. Accordingly, the beam guide fixing plate 15 and the optical filter fixing plate 16 may solve the problem that the sintering light L is not provided to the object S but absorbed in the housing.

Buffer Ring

The buffer ring may provide a function for alleviating impacts between the beam guide 20 and the first housing 11 and between the beam guide 20 and the beam guide fixing plate 15. In addition, the buffer ring may provide a function for alleviating impacts between the optical filter 30 and the second housing 12 and between the optical filter 30 and the optical filter fixing plate 16. Hereinafter, the buffer ring will be described in detail.

A first beam guide buffer ring 13*a* may be provided between the inner surface of the housing 10 and one surface of the beam guide 20. According to one embodiment, the first beam guide buffer ring 13*a* may be provided between an inner surface of the first housing 11 and one surface of the beam guide 20. Accordingly, the first beam guide buffer ring 13a may alleviate the impact generated between the inner surface of the housing 10 and the one surface of the beam guide 20.

In addition, a second beam guide buffer ring 13b may be provided between the other surface of the beam guide 20 and one surface of the beam guide fixing plate 15. Accordingly, the second beam guide buffer ring 13b may alleviate the impact generated between the other surface of the beam guide 20 and the one surface of the beam guide fixing plate 15. For example, the first and second beam guide buffer rings 13a and 13b may be rubber rings.

A first optical filter buffer ring 14a may be provided between the inner surface of the housing 10 and one surface of the optical filter 30. According to one embodiment, the first optical filter buffer ring 14a may be provided between the inner surface of the second housing 12 and the one surface of the optical filter 30. Accordingly, the first optical filter buffer ring 14a may alleviate the impact generated between the inner surface of the housing 10 and the one surface of the optical filter 30.

In addition, a second optical filter buffer ring 14b may be provided between the other surface of the optical filter 30 and one surface of the optical filter fixing plate 16. Accordingly, the second optical filter buffer ring 14b may alleviate the impact generated between the other surface of the optical filter 30 and the one surface of the optical filter fixing plate 16. For example, the first and second optical filter buffer rings 14a and 14b may be rubber rings.

In addition, a housing buffer ring 19 may be provided between the first housing 11 and the second housing 12. Accordingly, an impact generated between the first housing 11 and the second housing 12 may be alleviated.

Fastening Portion

The beam guide fixing plate 15 and the housing 10 may be partially fastened by a beam guide fastening portion 17. According to one embodiment, the beam guide fastening portion 17 may fasten parts of the beam guide fixing plate 15 and the first housing 11 from a position beyond an extension length of the beam guide. In other words, the beam guide fastening portion 17 may fasten the parts of the beam guide fixing plate 15 and the housing 10, without coming into contact with the beam guide 20. Accordingly, the beam guide fastening portion 17 may allow the beam guide 20 to be pressed and fixed between the beam guide fixing plate 15 and the housing 11. In particular, the fastening of the beam guide 20 outside in the extending direction may minimize a damage of the beam guide 20.

The optical filter fixing plate 16 and the housing 10 may be partially fastened by an optical filter fastening portion 18. According to one embodiment, the optical filter fastening portion 18 may fasten parts of the optical filter fixing plate 16 and the second housing 12 from a position beyond an extension length of the optical filter. In other words, the optical filter fastening portion 18 may fasten the parts of the optical filter fixing plate 16 and the housing 10, without coming into contact with the optical filter 30. Accordingly, the optical filter fastening portion 18 may allow the optical filter 30 to be pressed and fixed between the optical filter fixing plate 16 and the housing 12. In particular, the fastening of the optical filter 20 outside in the extending direction may minimize a damage of the optical filter 30.

According to one embodiment, the beam guide fastening portion 17 and the optical filter fastening portion 18 may be formed of a conductive metal material. Accordingly, heat of the cooling water W may be transferred and discharged to the outside of the housing 10.

The structure of the light sintering device 100 according to one embodiment of the present invention has been described. Hereinafter, a cooling mechanism of the light sintering device 100 according to one embodiment of the present invention will be described with reference to FIG. 5.

FIG. 5 is a view showing an operating state of the light sintering device according to the first embodiment of the present invention.

As described above when the light sintering process is performed, the beam guide 20 and the optical filter 30 may be heated by sintering light L irradiated from the xenon lamp. The cooling water W may be provided to the cooling hollow 10h of the light sintering device 100, so that heat may be absorbed from the beam guide 20 and the optical filter 30. In particular, since the cooling water W comes into direct contact with one surface of the beam guide 20 and one surface of the optical filter 30, the heat may be absorbed more effectively from the beam guide 20 and the optical filter 30. In other words, the beam guide 20 and the optical filter 30 may be effectively cooled.

The heat absorbed from the beam guide 20 and the optical filter 30 may be dissipated to the outside of the housing 10 through a main heat dissipation path ① and auxiliary heat dissipation paths ②, ③ and ④.

The main heat dissipation path ① may be the same as the moving direction of the cooling water W. In other words, the cooling water W introduced to the cooling hollow 10h through the inlet 11a may absorb the heat generated from the beam guide 20 and the optical filter 30, and discharge the heat to the outside of the housing 10 through the outlet 11b.

The auxiliary heat dissipation paths ②, ③ and ④ may include a first auxiliary heat dissipation path a, a second auxiliary heat dissipation path ③, and a third auxiliary heat dissipation path ④.

The first auxiliary heat dissipation path a may be formed in the direction of sequentially passing the beam guide fixing plate 15, the beam guide fastening portions 17a and 17b, and the housing 10. In other words, the heat absorbed by the cooling water W from the beam guide 20 and the optical filter 30 may be transferred to the beam guide fixing plate 15, and the heat transferred to the beam guide fixing plate 15 may be dissipated to the outside through the housing 10 after passing the beam guide fastening portions 17a and 17b.

The second auxiliary heat dissipation path ③ may be formed in the direction of sequentially passing the optical filter fixing plate 16, the optical filter fastening portions 18a and 18b, and the housing 10. In other words, the heat absorbed by the cooling water W from the beam guide 20 and the optical filter 30 may be transferred to the optical filter fixing plate 16, and may be dissipated to the outside through the housing 10 after passing the optical filter fastening portions 18a and 18b.

The third auxiliary heat dissipation path ④ may be formed in the direction connected to the outside through the housing 10. In other words, as described with reference to FIGS. 2 and 3, the housing 10 may be formed of metal having a high heat transfer rate, and the cooling water W may come into contact with the housing 10, so that the heat absorbed by the cooling water W may be dissipated to the outside through the housing 10.

The cooling mechanism of the light sintering device according to one embodiment of the present invention has been described with reference to FIG. 5. Hereinafter, a method for manufacturing the light sintering device according to one embodiment of the present invention will be described with reference to FIGS. 6A, 6B, 6C, 6D, 6E and 6F.

FIGS. 6A, 6B, 6C, 6D, 6E and 6F are views showing a part of a manufacturing method of the light sintering device according to the first embodiment of the present invention.

According to one embodiment, the manufacturing method of the light sintering device 100 may include manufacturing a first housing 11 to which the beam guide 20 is mounted; manufacturing a second housing 12 to which the optical filter 30 is mounted; and coupling the first housing 11 mounted therein with the beam guide 20 to the second housing 12 mounted therein with the optical filter 30.

Referring to FIGS. 6A to 6F, the step of manufacturing the second housing 12 mounted therein with the optical filter 30 may include preparing a second housing 12 formed therein with a hollow (a); disposing the first optical filter buffer ring 14a along a periphery of the hollow formed therein (b); disposing the optical filter 30 on the optical filter buffer ring 14a (c); disposing the second optical filter buffer ring 14b on the optical filter 30 (d); disposing the optical filter fixing plate 16 on the second optical filter buffer ring 14b and fixing the optical filter fixing plate 16 by using the optical filter fastening portion 18 (e); and disposing the housing buffer ring 19 on the second housing 12 (f).

Although not shown, as in the step of manufacturing the second housing 12 to which the optical filter 30 is mounted, the step of manufacturing a first housing 11 to which the beam guide 20 is mounted may include: preparing the first housing 11 formed therein with the inlet 11a, the outlet 11b and a hollow; disposing the first beam guide buffer ring 13a along the periphery of the hollow formed therein; disposing the beam guide 20 on the beam guide buffer ring 13a; disposing the second beam guide buffer ring 13b on the beam guide 20; and disposing the beam guide fixing plate 15 on the second beam guide buffer ring 13b, and fixing the beam guide fixing plate 15 by using the beam guide fastening portion 17.

Then, the second housing 12 mounted therein with the optical filter 30 and the first housing 11 mounted therein with the beam guide 20 may be coupled to each other, so that the light sintering device 100 according to the first embodiment may be manufactured.

the above-mentioned light sintering device 100 according to the embodiments of the present invention may include: the housing 10 formed therein with the cooling hollow 10h through which the cooling water flows; the beam guide mounted on one side of the housing 10 to form one wall of the cooling hollow 10h, and configured to guide the sintering light L; and an optical filter 30 mounted on the other side of the housing 10 to face the beam guide 20 so as to form the other wall of the cooling hollow 10h, and configured to filter a specific wavelength band of the sintering light L.

As the temperature of the optical filter 30 rises to a high temperature by the sintered light L during the sintering process, the coating of the optical filter 30 may be delaminated. As the cooling water W is provided to come into contact with the optical filter 30 the coating may be prevented from being delaminated, so that the surface plasma effect of the object to be light-sintered may be improved.

In addition, the cooling hollow 10h may be fully filled with the cooling water to come into direct contact with both of the beam guide 20 and the optical filter 30. Accordingly, when the cooling water W is filled in the cooling hollow 10h, the beam guide 20 and the optical filter 30 may be cooled together. In addition, when the cooling hollow 10h is fully filled with the cooling water W, steam and bubbles may be minimally generated in the cooling hollow 10h even when a temperature of the cooling water W is increased by the sintering light L. As a result, when the steam is prevented, a path distortion of the sintering light L can be minimized, and when the bubbles are prevented, a damage to the housing 10, the beam guide 20, and the optical filter 30 due to bubble explosion can be minimized.

As described with reference to FIGS. 2 to 5, in the light sintering device 100 according to the first embodiment, the height levels h1 and h2 of the inlet and the outlet may be configured to be higher than the height level h3 of the beam guide to allow the cooling water to be fully filled so as to come into direct contact with both of the beam guide 20 and the optical filter 30. In contrast, in the light sintering device 100 according to another embodiment of the present invention, the height level h1 of the inlet, the height level h2 of the outlet, and the height level h3 of the beam guide may be controlled to allow the cooling water to be fully filled so as to come into direct contact with both of the beam guide 20 and the optical filter 30.

Hereinafter, a light sintering device 100 according to second and third embodiments, which has a height different from the height level h1 of the inlet, the height level h2 of the outlet, and the height level h3 of the beam guide in the light sintering device 100 according to the first embodiment, will be described with reference to FIGS. 7 and 8. The light sintering device 100 according to the second and third embodiments may have the same configuration as the other configurations except for the inlet 11a and the outlet 11b of the light sintering device 100 according to the first embodiment. Hereinafter, a comparing configuration will be described in detail.

FIG. 7 is a sectional view of a light sintering device according to a second embodiment of the present invention.

Referring to FIG. 7, the light sintering device 100 according to the second embodiment may have the height levels h1 and h2 of the inlet 11a and the outlet 11b lower than the height level h3 of the beam guide 20. Specifically, the inlet 11a and the outlet 11b may be arranged at a height level between the beam guide 20 and the optical filter 30.

The outlet 11b may have a sectional area d2 smaller than a sectional area d1 of the inlet 11a. Accordingly, since the flow rate of the cooling water W introduced through the inlet 11a is greater than the flow rate of the cooling water W discharged through the outlet 11b, the inner hollow 10h may be fully filled with cooling water.

In other words, the inner hollow 10h may be fully filled such that the cooling water W comes into direct contact with both of the beam guide 20 and the optical filter 30.

FIG. 8 is a sectional view of a light sintering device according to a third embodiment of the present invention.

Referring to FIG. 8, the light sintering device 100 according to the third embodiment may have the height level h1 of the inlet lower than the height level h3 of the beam guide, and may have the height level h2 of the outlet higher than the height level h3 of the beam guide.

Specifically, the inlet 11a may be arranged at the height level between the beam guide 20 and the optical filter 30, and the outlet 11b may be arranged at the height level higher than the beam guide 20. Accordingly, when the cooling water W is provided to the inner hollow 10h, the inner hollow 10h may be fully filled such that the cooling water W comes into direct contact with both of the beam guide 20 and the optical filter 30.

Hereinafter, a cooling method for the light sintering device according to the embodiments of the present invention will be described with reference to FIGS. 9 to 13.

FIG. 9 is a flow chart explaining a cooling method for the light sintering device according to the embodiment of the present invention.

Referring to FIG. 9, the cooling method for the light sintering device according to the embodiment may include a light irradiation step S100, and a cooling step S200. In light irradiation step S100, light may be irradiated to the object through the optical filter for filtering the sintering light L from the beam guide for guiding the sintering light L.

In cooling step S200, the cooling water may be provided to fill the cooling hollow defined by the beam guide as one wall and the optical filter as the other wall, so that the beam guide and the optical filter heated by light irradiation step S100 may be cooled together. In cooling step S200, the cooling hollow may be fully filled with the cooling water.

In order to enable the cooling water to fully fill the cooling hollow, a first cooling water circulation mode, a second cooling water circulation mode, or a third cooling water circulation mode may be provided in cooling step S200. Hereinafter, the first to third cooling water circulation modes will be described in detail with reference to FIGS. 10 to 13.

FIG. 10 is a flowchart specifically explaining step S200 illustrated in FIG. 9. FIGS. 11 and 13 are views showing first to third cooling water circulation modes in the cooling method for the light sintering device according to the embodiment of the present invention. In another aspect, the first cooling water circulation mode may be implemented by the first embodiment of the present invention, the second cooling water circulation mode may be implemented by the second embodiment of the present invention, and the third cooling water circulation mode may be implemented by the third embodiment of the present invention.

Referring to FIGS. 10 and 11, in the first cooling water circulation mode S210, the cooling water W may be introduced at a higher level than the beam guide 20, and discharged at a higher level than the beam guide 20.

Referring to FIGS. 10 and 12, in the second cooling water circulation mode S220, the cooling water W may be introduced at a height level between the beam guide 20 and the optical filter 30, and discharged at the height level between the beam guide 20 and the optical filter 30, wherein the outlet 11b may have a sectional area d2 smaller than a sectional area d1 of the inlet 11a.

Referring to FIGS. 10 and 13, in the third cooling water circulation mode S230, the cooling water W may be introduced at a height level between the beam guide 20 and the optical filter 30, and discharged at the height level higher than the beam guide.

Accordingly, the light sintering device according to one embodiment of the present invention may cool the beam guide 20 and the optical filter 30 together through the first to third cooling water circulation modes.

FIGS. 14A, 14B, 15A and 15B are views showing a light sintering device according to a fourth embodiment of the present invention.

Referring to FIGS. 14A, 14B, 15A and 15B, the light sintering device 100 according to the fourth embodiment may be composed of one housing 10, unlike the light sintering device 100 according to the above-described first to third embodiments.

Accordingly, in the light sintering device 100 according to the fourth embodiment as shown FIGS. 14A and 14B, the second beam guide buffer ring 13b, the beam guide 20, the first beam guide buffer ring 13a, and the beam guide fixing plate 15 may be sequentially disposed on the top of housing 10 and fixed by the beam guide fastening portion 17.

In addition, in the light sintering device 100 according to the fourth embodiment as shown FIGS. 15A and 15B, the first optical filter buffer ring 14a, the optical filter 30, the second optical filter buffer ring 14b, and the optical filter fixing plate 16 may be sequentially disposed on the top of the housing 10 and fixed by the optical filter fastening portion 18.

FIG. 16 is a sectional view of the light sintering device 100 according to the fourth embodiment of the present invention.

Referring to FIG. 16, in the light sintering device 100 according to the fourth embodiment, the inlet 10a and the outlet 10b may have the height levels h1 and h2 lower than the height level h3 of the beam guide 20, like the light sintering device according to the second embodiment described with reference to FIG. 7. Specifically, the inlet 10a and the outlet 10b may be arranged at the height level between the beam guide 20 and the optical filter 30.

The sectional area d2 of the outlet 10b may be smaller than the sectional area d1 of the inlet 10a. Accordingly, since the flow rate of the cooling water W introduced through the inlet 10a is greater than the flow rate of the cooling water W discharged through the outlet 10b, the inner hollow 10h may be fully filled with cooling water.

In other words, the inner hollow 10h may be fully filled such that the cooling water W comes into direct contact with both of the beam guide 20 and the optical filter 30.

The light sintering device and the cooling method for the light sintering device according to the embodiments of the present invention provide the cooling water W to the cooling hollow 10h during the sintering process, so that the beam guide 20 and the optical filter 30 having the temperature increased to a high temperature by the sintering light L can be cooled together. Accordingly, the light sintering device 100 can be continuously cooled in a process, such as a roll-to-roll process, of continuously sintering objects to be sintered, so that the sintering efficiency can be improved.

Although the present invention has been described in detail with reference to the preferred embodiments, the present invention is not limited to the specific embodiments and shall be interpreted by the following claims. Further, it will be apparent that a person having ordinary skill in the art may carry out various deformations and modifications for the embodiments described as above within the scope without departing from the present invention.

The invention claimed is:

1. A light sintering device comprising:
a housing formed therein with a cooling hollow through which cooling water flows;
a beam guide mounted on one side of the housing to form one wall of the cooling hollow, and configured to guide sintering light; and
an optical filter mounted on an opposite side of the housing to face the beam guide to form an opposite wall of the cooling hollow, and configured to filter a specific wavelength band of the sintering light,
wherein the light sintering device further comprises at least one of:
a first beam guide buffer ring provided between an inner surface of the housing and one surface of the beam guide to buffer a space between the inner surface of the housing and the one surface of the beam guide, and
a first optical filter buffer ring provided between the inner surface of the housing and one surface of the optical filter to buffer a space between the inner surface of the housing and the one surface of the optical filter.

2. The light sintering device of claim 1, wherein the cooling hollow is fully filled with the cooling water such that the cooling water comes into direct contact with both of the beam guide and the optical filter.

3. The light sintering device of claim 1, wherein the housing includes an inlet for introducing the cooling water into the cooling hollow, and an outlet for discharging the cooling water introduced into the cooling hollow, and wherein the inlet and the outlet have height levels higher than a height level of the beam guide.

4. The light sintering device of claim 1, wherein the housing includes an inlet for introducing the cooling water into the cooling hollow, and an outlet for discharging the cooling water introduced into the cooling hollow, and wherein the inlet and the outlet may be arranged at a height level between the beam guide and the optical filter, and the outlet has a sectional area smaller than a sectional area of the inlet.

5. The light sintering device of claim 1, wherein the housing includes an inlet for introducing the cooling water into the cooling hollow, and an outlet for discharging the cooling water introduced into the cooling hollow, wherein the inlet is arranged at a height level between the beam guide and the optical filter, and the outlet has a height level higher than a height level of the beam guide.

6. The light sintering device of claim 1, further comprising at least one of:

a beam guide fixing plate for covering at least a part of the beam guide to fix the beam guide, and reflecting the sintering light, and an optical filter fixing plate for covering at least a part of the optical filter to fix the optical filter and reflecting the sintering light.

7. The light sintering device of claim 6, further comprising at least one of:

a beam guide fastening portion configured to fasten parts of the beam guide fixing plate and the housing from a position beyond an extension length of the beam guide; and an optical filter fastening portion configured to fasten parts of the optical filter fixing plate and the housing from a position beyond an extension length of the optical filter.

8. The light sintering device of claim 7, wherein heat of the cooling water in the cooling hollow is dissipated to an outside through at least one of:

a first auxiliary heat dissipation path for dissipating the heat to the outside through the housing from the beam guide fixing plate by way of the beam guide fastening portion; and a second auxiliary heat dissipation path for dissipating the heat to the outside through the housing from the optical filter fixing plate by way of the optical filter fastening portion.

9. The light sintering device of claim 8, wherein the housing includes a first housing to which the beam guide is mounted to form one wall of the cooling hollow, and a second housing to which the optical filter is mounted to form an opposite wall of the cooling hollow.

\* \* \* \* \*